United States Patent [19]
Lightbody et al.

[11] Patent Number: 6,000,034
[45] Date of Patent: Dec. 7, 1999

[54] SECURITY SYSTEM AND METHOD FOR REVENUE CLASS ELECTRICITY METER

[75] Inventors: Simon Lightbody, Victoria; David W. Giles, Sidney; Michael Teachman; Simon C. S. Ki, both of Victoria, all of Canada

[73] Assignee: Power Measurement Ltd., Canada

[21] Appl. No.: 08/851,941

[22] Filed: May 6, 1997

[51] Int. Cl.⁶ .............................. G06F 12/14; G06F 15/16
[52] U.S. Cl. ...................... 713/202; 713/20; 340/800.02; 380/4
[58] Field of Search .................................... 324/110, 156; 702/60, 62, 64; 395/186, 188.01; 340/870.02; 379/106.07; 713/200, 202

[56] References Cited

U.S. PATENT DOCUMENTS

| | | | |
|---|---|---|---|
| 2,063,349 | 7/1936 | Sharp | 324/110 |
| 4,731,575 | 3/1988 | Sloan | 324/113 |
| 4,908,769 | 3/1990 | Vaughan et al. | 705/412 |
| 5,537,333 | 7/1996 | Hemminger et al. | 702/60 |
| 5,541,589 | 7/1996 | Delany | 340/870.02 |
| 5,590,179 | 12/1996 | Shincovich et al. | 379/106.06 |
| 5,627,759 | 5/1997 | Bearden et al. | 702/62 |

Primary Examiner—Larry D. Donaghue
Attorney, Agent, or Firm—Brinks Hofer Gilson & Lione

[57] ABSTRACT

A security system for programmable revenue class electricity meters. Each programmable revenue class electricity meter includes a metering portion or stage that couples to a power line. The metering portion is responsive to and senses the electricity in the power line and provides a digital output. The programmable revenue class electricity meter includes a processor that runs programming that records, calculates, and/or stores data relating to the electricity sensed by the metering portion. In particular, the programming records, calculates, and/or stores revenue-related data that can be used for calculating charges for the electricity. The programming can be changed by authorized persons to modify the types of data that can be measured, calculated, recorded, displayed, communicated, and/or stored for any desired purpose and in particular for revenue-related purposes. Modification of the programming and access to information is limited to authorized persons by means of the security system. The security system includes security system programming in the meter that checks for a code word that is required to be input prior to any changes to the revenue-related programming can be effected. The security system programming compares the input code word to a code word stored in the meter and unlocks restrictions on modification of the revenue-related programming if the input code word matches the stored code word.

27 Claims, 14 Drawing Sheets

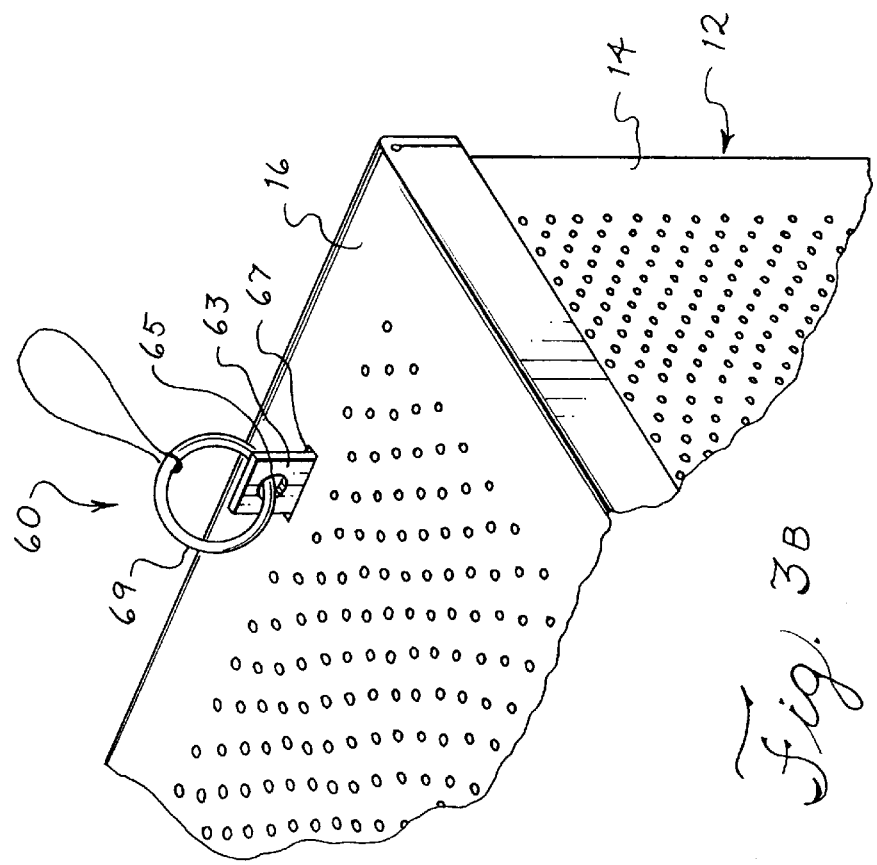
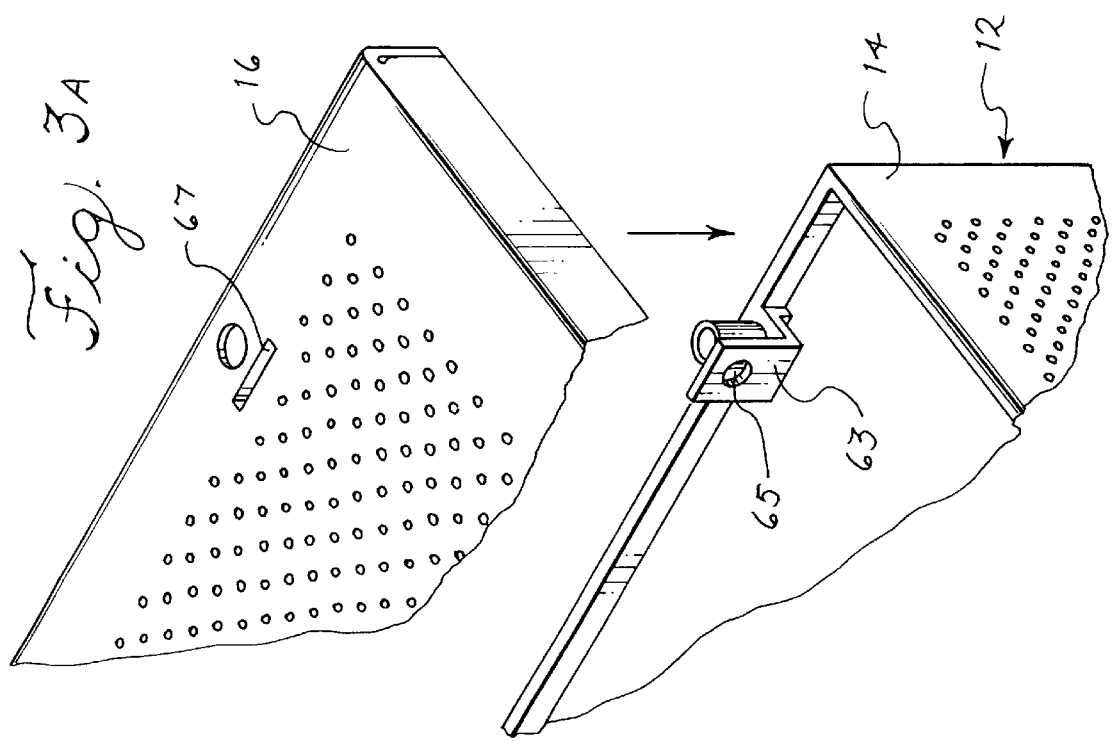

SECURITY SYSTEM AND METHOD FOR REVENUE CLASS ELECTRICITY METER

REFERENCE TO COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

The present invention relates to revenue-class electricity meters.

Revenue-class electricity meters are types of electricity meters used to measure various electrical parameters for the purpose of charging customers for the use of electricity. The quantities of various parameters of electricity measured by revenue-class electricity meters are used as the basis for financial transactions between electricity suppliers (e.g. utilities) and consumers. Consequently, it is necessary for both the electricity supplier and the consumer/customer to have confidence in the accuracy and the integrity of the measurements performed by the revenue-class electricity meter. To achieve this, the revenue-class electricity meter should provide measurements that are within industry-accepted limits for accuracy over a defined range of operating conditions. In addition, the revenue-class electricity meter should provide adequate protection against unauthorized alteration of the measured quantities.

The first requirement has been typically addressed by international or national standards. Protection against unauthorized alteration has been provided by a combination of national and utility-based standards.

In general, conventional security safeguards for revenue-class electricity meters have been mechanical in nature. Such conventional safeguards have relied on several factors related to the fundamental design characteristics of mechanical and electromechanical meters to prevent tampering. Conventional revenue-class electricity meters have been inherently fixed in their configuration (i.e. non-programmable). Conventional revenue-class electricity meters have been typically made-to-order in terms of their service-types (2-el delta, 2.5-el star, 3-el, and so on), in terms of their factory-set VT and CT ratios, their factory-set pulse output constants, and so on. In general, conventional revenue-class electricity meters have been factory-built for a specific type of installation and were not field-configurable or programmable.

Conventional revenue-class electricity meters did not provide any capability for remote reconfiguration (or re-programming) of their operating characteristics. Not only were the service type, VT and CT ratios, and pulse output constants factory-set, but also important functions such as energy and demand registers (e.g.: kWh, kVArh, peak kW Demand), time-of-use calendar re-configuration, time-of-use register resets, etc., also could not be changed or reconfigured.

A conventional revenue-class electricity meter commonly employed a simple mechanical seal as a safeguard to prevent unauthorized persons from modifying or otherwise tampering with the measurements performed by the meter. Traditional S-base meters (socket-based with a glass or similar cover) used this type of anti-tamper seal. With these conventional meters, a metal ring was used to secure the meter to the meter socket. To complete an installation of this type of meter, a utility metering technician affixed a metal or plastic seal so that the metal ring could not be removed without breaking the seal. When the meter was later read by a meter reader, the seal was normally inspected for possible signs of tampering.

With the advent of microprocessor-based meters in the early 1980's, utilities and industrial customers were able to purchase a single power/energy monitoring instrument that could be field-configured for a wide range of installations and service configurations. With these new types of meters (which were not generally revenue-class meters), it was no longer necessary to specify all of the meter characteristics at the time of ordering. Specifically, it was not necessary to specify the type of network to be monitored (for example 4-wire star, 3-wire-delta, single-phase etc.), or the VT and CT ratios, the demand period, or any of several other characteristics that may be unique to a particular installation. One such electricity meter that is highly reconfigurable is the Model 7700ION power meter manufactured by Power Measurement Ltd. of Saanichton, B.C., Canada.

The high level of programmability offered by microprocessor-based meters presented a problem to utilities and customers with regard to preventing unauthorized alteration of programmable meter configuration or revenue register values. Therefore, in general, programmable microprocessor-based meters have not been used as revenue-class electricity meters.

Accordingly, it is an object of the present invention is to provide a programmable revenue-class electricity meter that provides a level of security against unauthorized access or tampering of revenue-related parameters, while leaving the rest of the functionality of the device configurable.

It is a further objective to provide an electricity meter that is reconfigurable remotely in a very secure manner, while still maintaining seal integrity.

It is still a further objective to provide selective access to meter information.

SUMMARY OF THE INVENTION

To address the above concerns, the present invention provides a security system for programmable revenue class electricity meters. Each programmable revenue class electricity meter includes a metering portion or stage that couples to a power line. The metering portion is responsive to and senses the electricity in the power line and provides a digital output. The programmable revenue class electricity meter includes a processor that runs programming that records, calculates, and/or stores data relating to the electricity sensed by the metering portion. In particular, the programming records, calculates, and/or stores revenue-related data that can be used for calculating charges for the electricity. The programming can be changed by authorized persons to modify the types of data that can be measured, calculated, recorded, displayed, communicated, and/or stored for any desired purpose and in particular for revenue-related purposes. Modification of the programming and access to information is limited to authorized persons by means of the security system. The security system includes security system programming in the meter that checks for a code word that is required to be input prior to any changes to the revenue-related programming can be effected. The security system programming compares the input code word to a code word stored in the meter and unlocks restrictions on modification of the revenue-related programming if the input code word matches the stored code word.

In one aspect, the security system includes a programming key that can be physically installed in and removed from any of the revenue class electricity meters. The programming key includes a memory that includes an addressable code word. When the programming key is installed in one of the revenue class electricity meters, the memory on the programming key is addressable by the revenue class electricity meter. A utility program can be run that enables modification of the types of data that can be recorded, calculated, and/or stored by the revenue class electricity meter for revenue-related purposes. When any attempt is made to access the revenue-class electricity meter, a security program is run that checks for the presence of the programming key by attempting to address the code word in the memory on the programming key. If the programming key is not installed, the code word cannot be addressed by the security program, and the revenue-related data cannot be modified. If the code word can be addressed by the security program, modification of the revenue-related data is enabled.

Another aspect of the programmable revenue class electricity meter is an electronic nameplate. According to this aspect, the programmable revenue class electricity meter includes Government-required or utility-mandated nameplate information in a non-volatile memory in the meter. The Government-required or utility-mandated nameplate information includes such information as the serial number, the Government approval number, and so on. The revenue-class electricity meter includes a routine that provides for the visual display of the required nameplate information on a display panel of the meter. Upon receiving the appropriate commands, the routine reads the nameplate data stored in the non-volatile memory and writes the strings of these data to the display panel thereby eliminating the need to affixing a separate label onto the electricity meter. The nameplate information can also be read remotely via the communications network.

BRIEF DESCRIPTION OF THE DRAWINGS

FIG. 3A is a partial perspective view of a corner of the housing of the revenue-class electricity meter of FIG. 1 showing the cover removed.

FIG. 3B is a partial perspective view of a corner of the housing of the revenue-class electricity meter of FIG. 1 with the cover shown installed.

DETAILED DESCRIPTION OF THE PRESENTLY PREFERRED EMBODIMENTS

Figure 1:
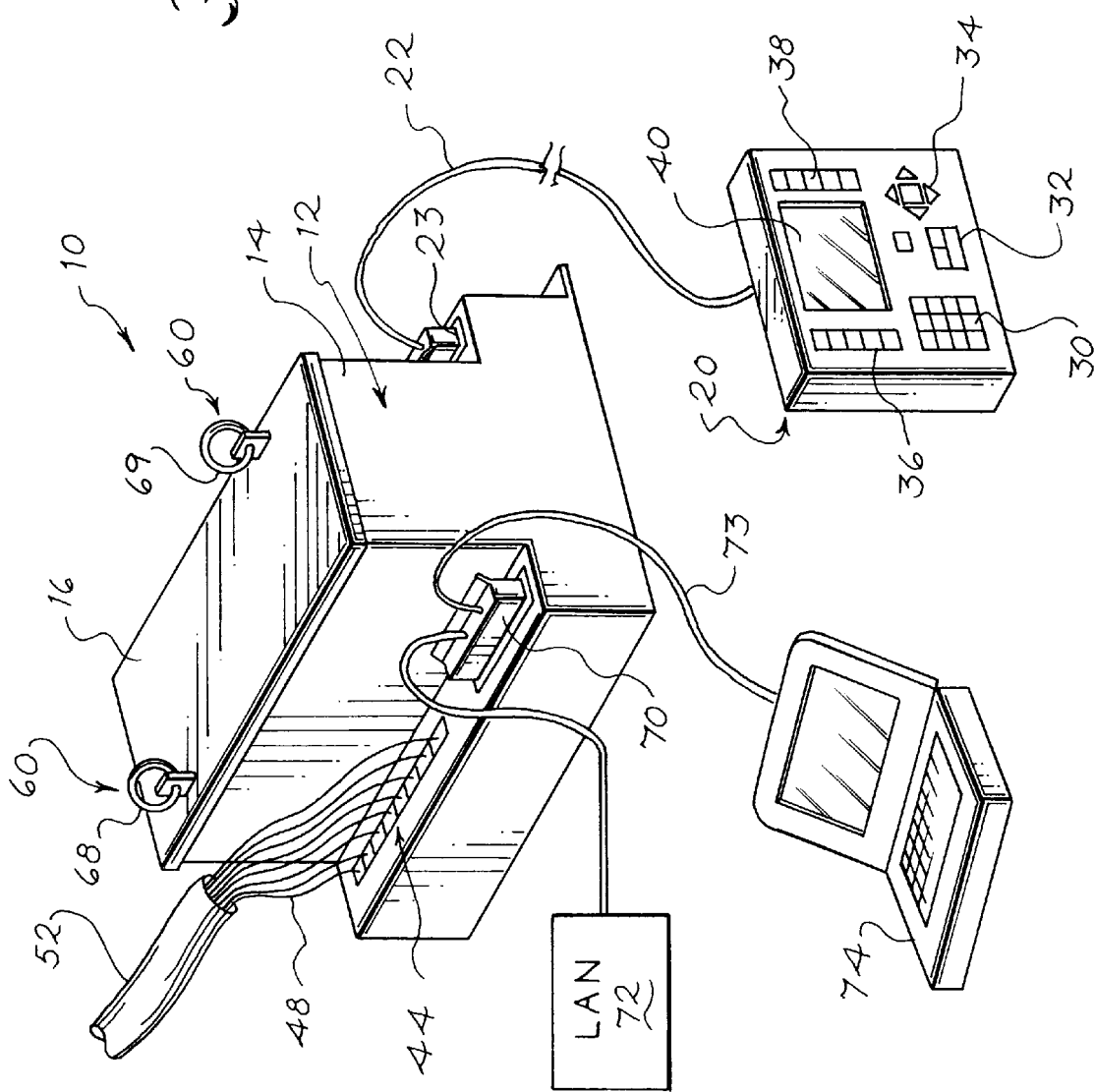
FIG. 1 is a perspective view of a revenue-class electricity meter according to a first embodiment of the present invention.
Figure 2:
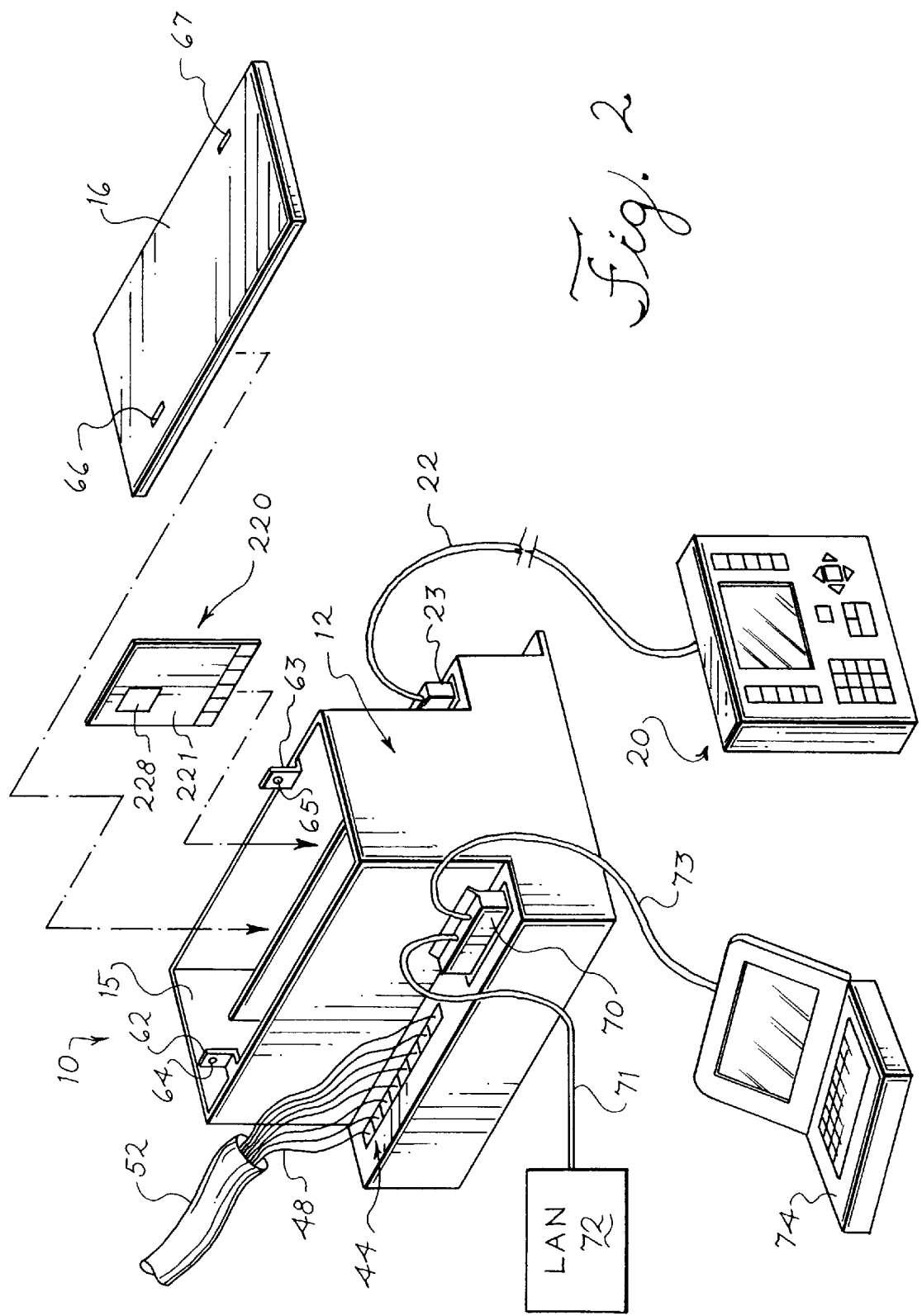
FIG. 2 is a perspective view of the revenue-class electricity meter of FIG. 1 with the cover shown removed.

FIGS. 1 and 2 show a revenue-class electricity meter 10 according to a first embodiment. The revenue-class electricity meter 10 is reconfigurable and programmable, as explained below. The revenue-class electricity meter 10 includes a housing 12 having a bottom housing portion 14 defining an interior 15 and a removable top side 16 which forms a removable cover or lid portion. The revenue-class electricity meter 10 also includes a user interface portion 20. The user interface portion 20 comprises a unit separate from the housing 12. The user interface portion 20 is coupled to the housing 12 by means of cabling 22 which connects to a suitable port 23 located on the housing 12. The user interface portion 20 includes one or more input panels 30, 32, 34, 36, and 38. Each of the input panels includes one or more key pads or buttons. Located on a front side of the user interface portion 20 is a display screen 40.

The housing 12 includes input terminals 44. Coupled to the input terminals 44 are one or more power lines 48. The power lines 48 are enclosed in a suitable conduit 52 (which is shown partially cut away in FIG. 1 to reveal the power lines 48 located therein).

As illustrated in FIG. 2, the top side 16 of the housing 12 is removable to provide access to the interior 15 of the housing 12 and in particular to provide access to a motherboard (motherboard 58 in FIG. 5) of the revenue-class electricity meter 10 located in the interior 15 of the housing 12.

Referring to FIGS. 2, 3A and 3B, the revenue-class electricity meter 10 includes a sealing arrangement 60. The sealing arrangement 60 mechanically seals the top side 16 to the lower portion 14 of the housing 12. In a present embodiment, the sealing arrangement 60 includes a first tab 62 and a second tab 63 located on the lower portion 14 of the housing 12. The first tab 62 has an opening 64 located therein and the second tab 63 has and opening 65 located therein. The cover 16 has opening 66 and 67 located to align with the first and second tabs 62 and 63 respectively. When the top side 16 is positioned on the lower portion 14 of the housing 12, the openings 66 and 67 are aligned with the tabs 62 and 63 so that the tabs extend through the openings 66 and 67. Lead rings 68 and 69 may be extended through the openings 64 and 65 thereby preventing removal of the top side 16 from the housing 12. This type of sealing arrangement provides the advantage that it can be readily determined by visual inspection if there has possibly been tampering since the ring must be broken in order to remove the lid.

Referring to FIGS. 1 and 2, located on a side of the lower housing portion 14 are one more data ports 70. The data ports 70 may include ports of conventional types, such as RS-232 or Ethernet type ports. Using appropriate cabling 71 the revenue-class electricity meter 10 may be coupled by means of one of the data ports 70 to a network 72 which may be a local area network or wide area network. Also, using appropriate cabling 73, the revenue-class electricity meter 10 may be coupled by means of one of the data ports 70 locally to a personal computer 74.

Figure 4:
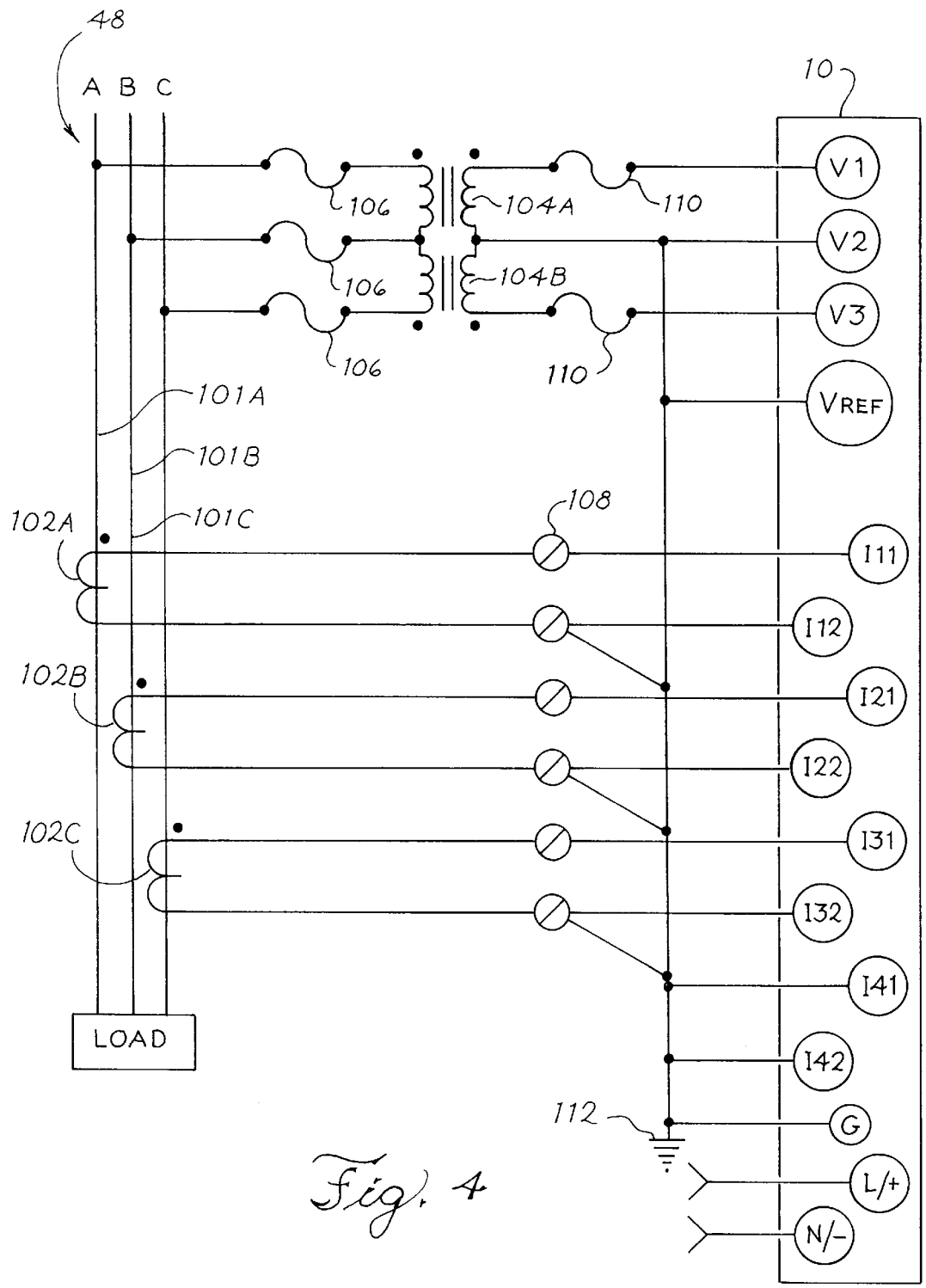
FIG. 4 is a schematic diagram illustrating the physical connection of the revenue-class electricity meter of FIG. 1 to the electric circuit.

FIG. 4 schematically illustrates how the revenue-class power meter 10 is connected to the power line 48. In FIG. 4, the power line 48 is shown to comprise a three wire power line. Three current transformers (CT's) 102A, 102B and 102C are connected to wires 101A, 101B and 101C of the power line 48, respectively. Potential transformers (PT's) 104A and 104B are connected between lines 101A, 101B and 101B, 101C, respectively. A plurality of fuses 106 are disposed between the lines 101A–101C and PT's 104A and 104B. Fuses 110 are connected between PT's 104A and 104B and unit 100. The CT's 102A–102C are connected through a shorting switch or test block 108 to the revenue-class electricity meter 10.

The CT's 102A–102C provide the revenue-class electricity meter 10 with current inputs I11, I12, I21, I22, I31, and I32. The PT's 104A and 104B provide the revenue-class electricity meter 10 with voltage inputs V1, V2 and V3. Current inputs 141 and 142, chassis ground 112 and voltage input VREF are connected to ground potential. The revenue-class electricity meter 10 is connected to a power supply, such as a standard 120V AC supply, through power leads L and N.

Figure 5:
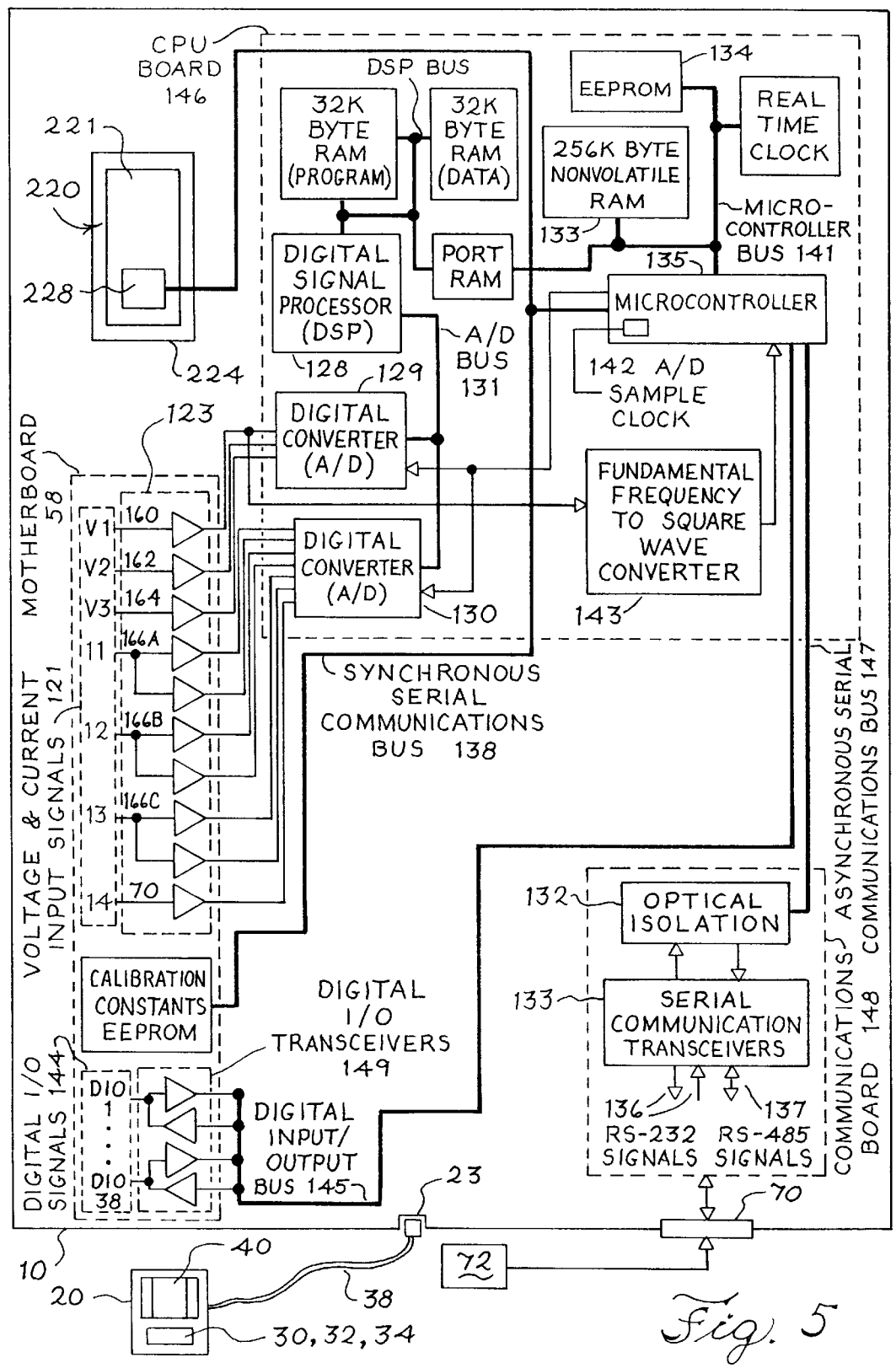
FIG. 5 is a schematic diagram of the revenue-class electricity meter of FIG. 1.

Referring now to FIG. 5, there is shown a schematic diagram of the revenue-class electricity meter 10. Three-phase voltage and current input signals V1–V3 and I1–I4 from power lines 48 enter the motherboard 58 and are converted to voltage levels compatible with the analog to digital converters (A/Ds) 129 and 130 by signal conditioning circuitry 123. In an exemplary embodiment, a suitable A/ID converter is a 13 bit, 7 input one available from National Semiconductor as model No. LM12458CIV. A suitable voltage to the A/D's 129 and 130 ranges from 0 to 5 volts depending on what part of the AC signal the sample is taken. The motherboard 58 may also send/receive digital I/O signals 144 through digital I/O transceivers 149 which are communicated to microcontroller 135 via digital input/output bus 145.

In the illustrated embodiment, the signal conditioning circuitry 123 comprises operational amplifiers (op amps) and associated circuitry 160, 162 and 164 which amplify V1, V2, and V3 respectively. The currents I1, I2, and I3 are amplified by two different scales to provide greater dynamic range. The amplification to the two different scales is implemented using the conditioning circuitry 123. Op amps 166A, 166B and 166C amplify input current signals I1, I2 and I3, respectively, to a first scale. For example, a current of 10 Amperes AC creates a voltage of 4 volts AC to the A/D converter. Op amps 168A, 168B and 168C amplify input current signals I1, I2 and I3, respectively to a second scale. For example, a current of 100 Amperes AC creates a voltage of 4 volts AC to the A/D converter. This arrangement permits the revenue-class electricity meter 10 to monitor current signals in the normal operating range (with a first scale) and out of normal range currents such as those experienced in transient conditions (with the second scale). In a present embodiment, the revenue-class electricity meter 10 can calculate power parameters for signals in both the normal operating range and for signals out of the normal operating range. The voltage and current signals enter separate A/Ds 129 and 130 so that the voltage and current on a particular phase can be simultaneously sampled.

A digital signal processor (DSP) 128 reads the samples from the A/D converters 129, 130 through the A/D bus 131. The signals are preferably sampled at the rate of 128 samples per line frequency cycle. The DSP 128 performs a Fast Fourier Transform (FFT) on the samples to determine the frequency components of the signal in a manner known in the art. It also calculates Root Mean Square (RMS) voltage and/or current for each input signal. These data are then transferred through dual port RAM 127 to the microcontroller 135 over microcontroller bus 141. A suitable DSP is a TMS320C25 available from Texas Instruments. The microcontroller 135 performs many functions within the electricity meter 10. The fundamental frequency to square wave converter 143 provides a square wave at the fundamental frequency of the incoming voltage signals. A suitable fundamental frequency to square wave converter 143 consists of an LM311D available from National Semiconductor configured in a manner known in the art.

A time processing unit (TPU) within the microcontroller 135 measures this frequency. The TPU also provides the ability to create a signal at a desired frequency. This capability is used to create the sample clock 142 for the A/D converters. Because the clock within the microcontroller 135 has a fixed frequency (e.g. 16.777 MHz), this sample clock has a fixed minimum resolution. The period of this clock can be adjusted to a value that has a resolution of 4 times the microcontroller's clock period, i.e. 238.4216 ns. A suitable microcontroller is the MC68332 available from Motorola.

Since the DSP 128 is receiving samples from the A/D converters at very close to 128 samples per line frequency cycle, it can perform a Fast Fourier Transform (FFT) on any group of 128 consecutive cycles. The result of the FFT is a set of phasors indicating the magnitude and phase of the fundamental frequency of the signal plus the magnitude and phase of the first 63 harmonics.

The synchronous communications bus 38 is also used to communicate with the display 40 via port 23. Results of all calculations and control functions of the microcontroller 135 can be displayed on the display 40. The display 40 provides graphical display capability which allows it to display bar graphs indicating the value of a parameter calculated by the microcontroller 135.

The bar graphs can be updated at a rate of 10 times per second. This provides the user with the ability to see rapid changes in a measured parameter which would be undetectable to the human eye if the parameter value was displayed in numerical format. In addition, the display 40 provides the ability to do the following: (1) display parameter values in text format; (2) graph the value of a parameter over time; (3) plot the spectrum of a given voltage or current input in graphical format in a similar fashion to a spectrum analyzer; (4) plot the waveform of a voltage or current input signal in graphical format; and (5) provides self configuration of its buttons so that the user can customize the display to provide certain information when a certain button is pressed. The synchronous serial communications bus 138 is also used to communicate with the display 40. Results of all calculations and control functions of the microcontroller 135 can be displayed on the display 40.

The revenue-class electricity meter 10 connects to the network 72 through the communications board 148 to which the data ports 70 are connected. The microcontroller 135 sends and receives information from a network 72 over the asynchronous serial communications bus 147. The communication board 148 comprises an optical isolation section 152, serial communication transceivers 153 which may send and/or receive RS-232 signals 136 and/or RS-485 signals 137.

In one embodiment, the revenue-class electricity meter 10 may be made and operated in accordance with the teachings of Ser. No. 08/367,534, now U.S. Pat. No. 5,736,847 entitled "High Accuracy Power Meter and Method", the disclosure of which is incorporated herein by reference.

In one embodiment, the revenue-class electricity meter 10 is operated using appropriate software, including programming and logic 190, to implement the desired functions, features, and operations. The software 190 may be implemented in alternative ways including various programming languages, scripts, and architectures, and combinations of software and firmware, etc. In one embodiment, the revenue-class electricity meter 10 operates internally and communicates on the network 72 using a modular and highly-configurable object-oriented programming architecture. One object-oriented programming approach is disclosed in patent application Ser. No. 08/369,849, now U.S. Pat. No. 5,650,936 entitled "Power Monitor Apparatus and Method with Object Oriented Structure", the disclosure of which is incorporated herein by reference.

Figure 6:
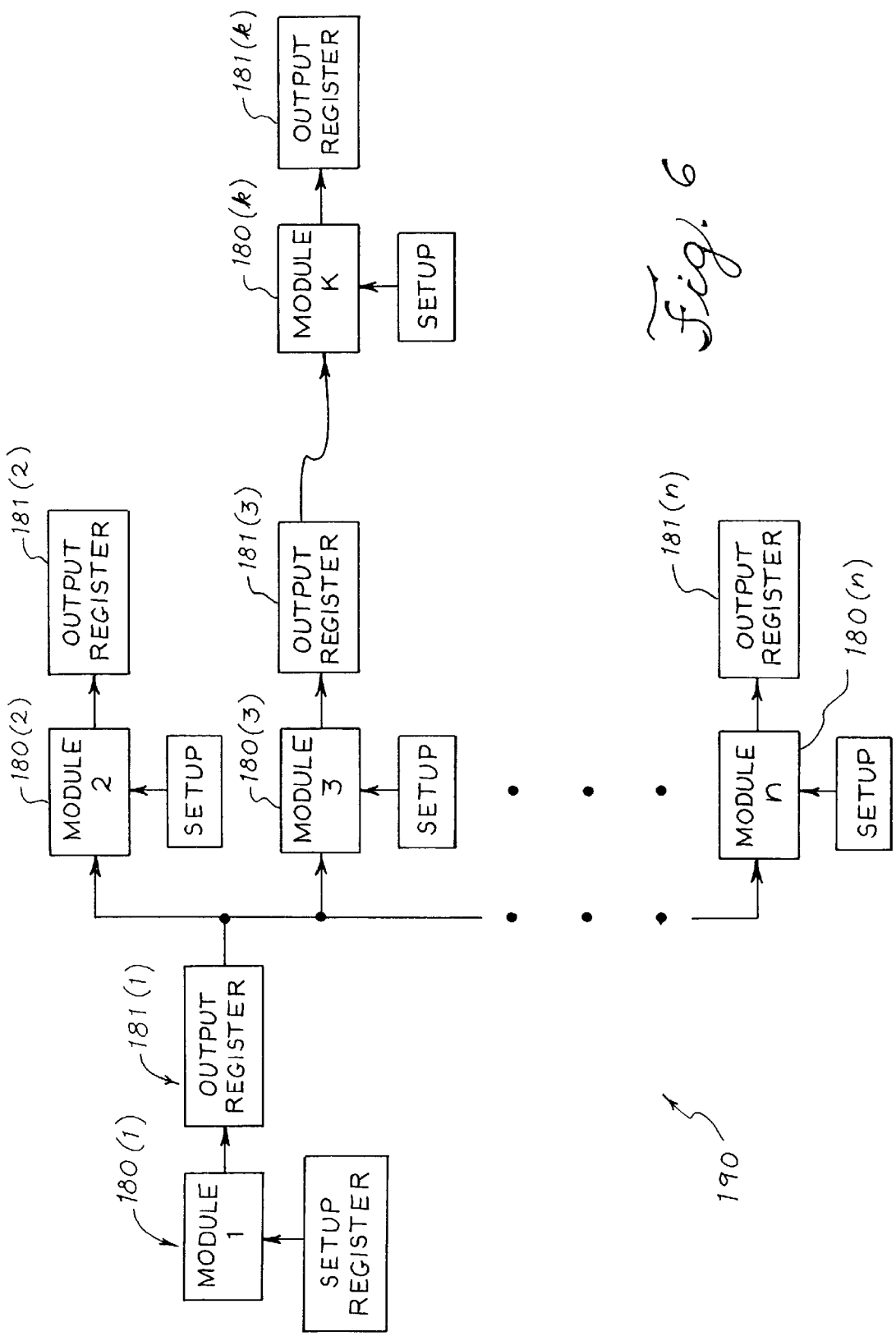
FIG. 6 is a block diagram illustrating a portion of the programming used to operate the revenue-class electricity meter of FIG. 1.

FIG. 6 is a diagram using the object-oriented architecture disclosed in the aforementioned application Ser. No. 08/369,849 and used for the programming 190 in one embodiment of the electricity meter 10. The diagram of FIG. 6 shows modules 180(1), 180(2), 180(3) . . . 180(n) . . . 180(k) which represent program objects. A "module" may be regarded to be an active object in the program architecture. Modules behave as both a client and a server. The client portion of a module contains the active components which perform the various tasks within the device. Modules act as "black boxes" that read data in at the inputs, manipulate the data in some fashion, and write the result to outputs. The inputs are read from registers and the outputs are written to registers. Each module may have output registers to which it writes its output. For example, module 180(1) writes its output to its output register 181(1). The modules 180(2), 180(3) . . . 180(n) use the data in the output register 181(1) as input. Module 180(k) uses the date in output register 181(3) as input and provides output to output register 181(k). The modules 180(2), 180(3) . . . 180(n) provide output to their respective output modules 181(2), 181(3) . . . 181(n), respectively. The objects shown in FIG. 6 include objects that may be physically located (or that may be regarded as "running") on the revenue-class electricity meter.

Because the revenue-class electricity meter 10 of FIGS. 1–6 is highly configurable, it has a security system that provides protection against unauthorized alteration or tampering of revenue-related quantities. The purpose of this security system is to prevent unauthorized alteration of revenue register values after the revenue-class electricity meter has been placed into service. The revenue-class electricity meter 10 incorporates one or more, and in a preferred embodiment all, of the following features: (1) a traditional anti-tamper mechanical seal (e.g. sealing arrangement 60 in FIGS. 1–3); (2) a hardware-based security system that uses a programming key; and (3) a password-based security system that permits resetting of certain non-revenue-related values, for example the min./max parameters. Each of these security features is described below.

As part of the security system in the revenue-class electricity meter 10, certain of the otherwise reconfigurable features of the revenue-class electricity meter are locked during manufacture of the meter. Specifically, all revenue-related modules, revenue-related setup registers, revenue-related inter-module links, and revenue-related output register values are locked in order to protect revenue-related quantities (including the basic meter configuration parameters including service-type, VT ratio and CT ratio) from unauthorized alteration. The manner in which these locks are implemented is described below. These locks are automatically enabled (at the factory) for the revenue-class electricity meter 10.

The following is a list of revenue-related modules, links and registers that are locked:

1 Power Meter Module (high-accuracy).
2 Integrator Modules #1 to #9 inclusive.
3 Pulser Module #1 to #3 inclusive.
4 Sliding Window Demand Module #1 to #3 inclusive.
5 Thermal Demand Module #1 to #3 inclusive.
6 Minimum Module #27 to #32 inclusive.
7 Maximum Module #27 to #32 inclusive.
8 Data Recorder Module #1.

These locks effectively prevent modification of any of the following:

| | |
|---|---|
| METER CONFIGURATION: | SERVICE-TYPE (Voltage mode). |
| | VT RATIO (Volts scale). |
| | CT RATIO (Amps scale). |
| RESET FUNCTIONS: | energy register reset. |
| METER RECORDING: | Data Recorder #1 |
| | (channel assignments & record interval). |
| PASSWORD PROTECTED | MIN/MAX register reset. |
| FNS: | This includes reset of maximum demand registers. |

In addition, the following are also protected: the sliding window demand period, the thermal demand period, the integrator rollover, the integrator divisor, the integrator mode, and the pulser value/pulse value.

In the revenue-class electricity meter 10, the following are considered to be revenue-related quantities:

kWh (import, export, net, total)
KVARh (import, export, net, total)
kVAh (import, export, net, total)
kW demand (TD and SD min (export), max (import))
kVAR demand (TD and SD min (export), max (import))
kVA demand (TD and SD min (export), max (import))
Historical trend recording of any of the above quantities.
This listing is provided by way of example and other quantities may be included or excluded, if desired.

As mentioned above, the revenue-class electricity meter 10 provides for programmability by authorized persons but prevents tampering by unauthorized persons. The means by which the revenue-related quantities are locked (to protect against tampering) is provided by including two features in the program within the EEPROM 134. First, when a revenue meter is produced in the factory, a predetermined bit expression code word is written into a predetermined location in the EEPROM 139 (in FIG. 5). When the program code in EEPROM 134 begins execution, it causes the microcontroller to read EEPROM 139. If it finds the predetermined bit expression code word there, it sets a flag indicating that this is a revenue meter. Second, if this is a revenue meter, the program code in EEPROM 134 attempts to read a second predetermined bit location in another EEPROM located on a programming key. This programming key is a removable card that can be temporarily installed in the electricity meter. If a certain second predetermined bit expression code is found in this other location, the programming key is considered to be inserted and security is not enabled. If it is not found, the programming key is considered to not be inserted and security is enabled. (When reference is made herein to a "program" or "routine", it is understood that these terms may refer to only portions or program code segments of larger "programs" or "routines.")

Figure 7:
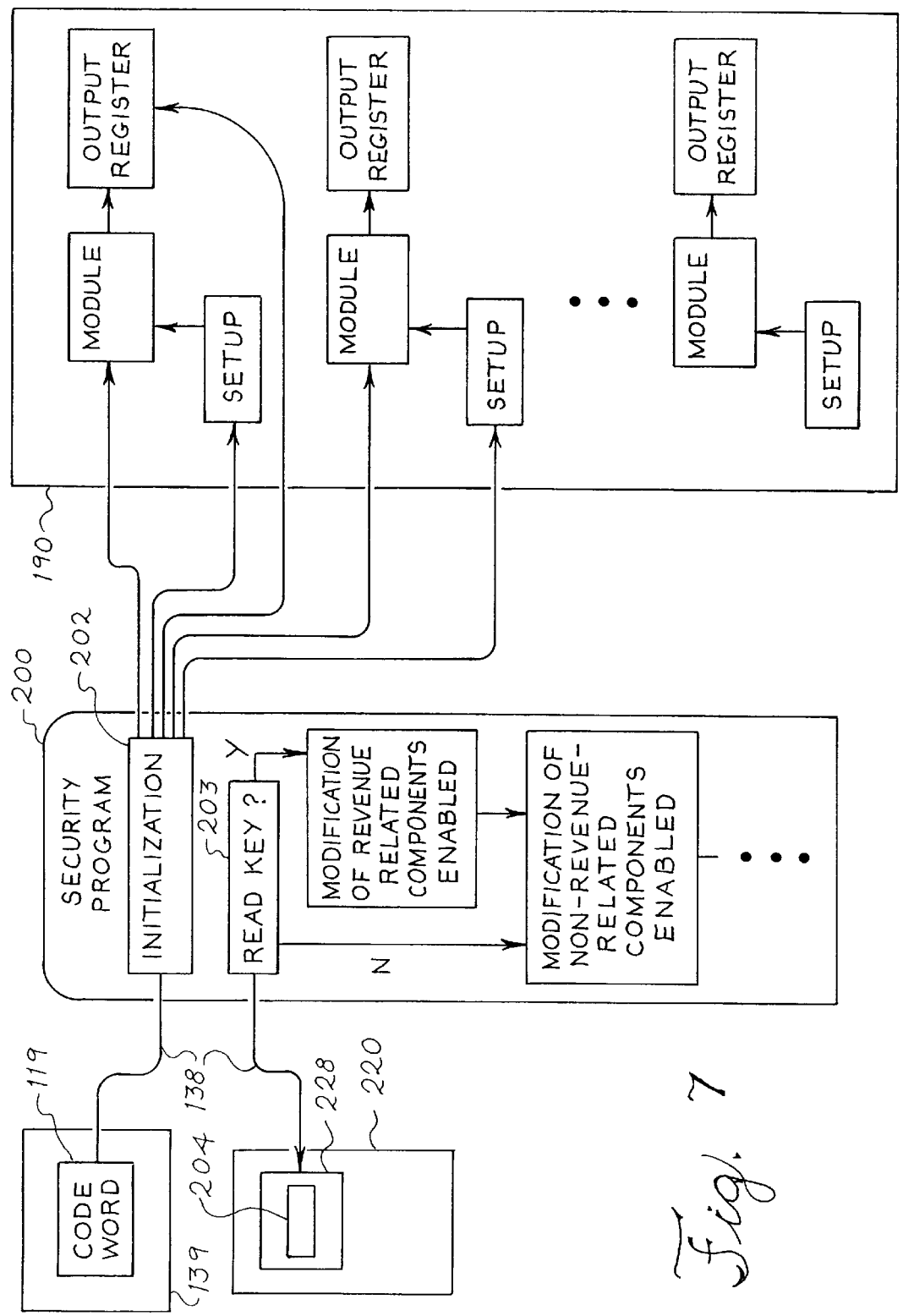
FIG. 7 is a block diagram illustrating a portion of the programming for reconfiguration of the operating parameters of the revenue-class electricity meter of FIG. 1.

Referring to FIG. 7, using a security program code segment (or routine) 200 running on the revenue-class electricity meter 10, it is possible, under certain conditions described below, to modify some or all of the programmed configuration of the revenue-class electricity meter 10. The security program code segment 200 is stored in the EEPROM 134 in the meter. Using the program 200, it is possible under the conditions described below to modify any of the setup registers, links, or modules. However, when the revenue-class electricity meter 10 is shipped to a customer, modification of the revenue-related quantities is not enabled. This program 200 may be run by the authorized person through the user interface 20 or with a personal computer, such as computer 74 in FIGS. 1 and 2, coupled over a communications link coupled to the port 70. The security program 200 and the utility program used to modify any of the programming parameters may be written in any suitable programming language, such as C.

Referring to FIGS. 2 and 5, to facilitate programming of the revenue-class electricity meter by the utility customer prior to sealing, a revenue meter programming key 220 is provided to the utility customer. When installed into the revenue-class electricity meter 10, the programming key 220 temporarily disables the revenue class electricity meter's built-in security locks thereby permitting custom programming of the electricity meter prior to sealing. The programming key 220 therefore eliminates the need to factory configure each revenue meter at the time of manufacture. The programming key 220 includes a small, pluggable circuit board 221 that fits into a connector, such as an auxiliary I/O slot 224 on the motherboard 58, inside the revenue class electricity meter 10.

Each utility customer purchases one or more programming keys 220. These keys 220 can be used in any revenue-class electricity meter 10 purchased by the utility. To program or configure the revenue-class electricity meter 10, the programming key 220 is installed into the slot 224 of the meter. Located on the printed circuit board 221 of the key 220 is an EEPROM 228. When the programming key 220 is installed in the slot 224, the memory in the EEPROM 228 is addressable by the meter CPU over the synchronous serial bus 138.

When a request to change configuration of the device is received over the communications network 72 or from the display 40, the request is first checked by the security routine 200 within the EEPROM 134 before being executed. If the security is enabled, a conditional expression prevents a change to any configuration that will affect a revenue-related quantity. Configuration changes that are not revenue-related or are outside the security umbrella are always allowed, so the device maintains most of the configurability provided by its object oriented structure.

Referring to FIGS. 3 and 7, when an authorized person desires to modify or program the revenue-class electricity meter 10, the authorized person removes the top cover 16 from the electricity meter housing 12. The authorized person then installs the programming key 220 into the slot 224 on the motherboard 58. The slot 224 connects to the synchronous communications bus 138 (in FIG. 5). Then, the program 200 is run. When the program 200 is run, the components in the revenue-class electricity meter 10 including the memories are addressable over the data buses (e.g. the synchronous communications bus 138) of the revenue-class electricity meter 10. The security program 200 includes an initialization stage 202 that includes a first conditional expression. This first conditional expression checks an address in the EEPROM 139 for a code word 119. If the code word 119 is found, a bit is set in the program 200 that the meter is a revenue class power meter. If the code word 119 is found, the program 200 then executes a second conditional expression in which it attempts to read an address on the EEPROM 228 on the programming key 220. Specifically, in the second conditional statement 203, the security program 200 attempts to read the predetermined code word 204 at a particular memory address. If the programming key 220 is installed, the security program 200 is able to address the EEPROM 228 on the key 200. If the predetermined code expression 204 has been stored at the predetermined memory address in the EEPROM 228 on the programming key 220, the security program 200 is able to read it. Under these conditions, the conditional statement 203 in the security program 200 is met and enables modification of all the parameters, including the revenue related quantities. If the programming key 220 is not installed, the security program 200 is unable to address the EEPROM 228 and the conditional statement 203 is not met. When the conditional statement 203 is not met (e.g. returns a false condition), only limited modification of the electricity meter programming is permitted. More specifically, all the revenue-related links, modules, setup registers and output registers cannot be modified if the security program 200 cannot access the bit expression code word 204 stored on the EEPROM 228 on the programming key 220.

After the revenue-class electricity meter 10 has been programmed, the authorized person removes the programming key 220 from the motherboard 58 of the meter. The action of removing the programming key 220 causes all the meter security systems to become enabled again.

Referring again to FIG. 3, after removal of the key 220, the meter cover/lid 16 is installed and the lead/wire seals 68 and 69 are installed through the openings 62 and 63 in the sealing tabs 64 and 65. As mentioned above in connection with FIG. 2, the revenue-class electricity meter 10 incorporates a sealing arrangement 60, including two sealing tabs 64 and 65, through which a traditional lead/wire seal, such as seals 68 and 69, can be inserted. When utilized, the sealing arrangement 60 effectively prevents unauthorized persons from gaining access to the inside of the housing 12 of the revenue-class electricity meter 10. The revenue-class electricity meter 10 is now ready for service.

Although all the revenue-related modules, links, and registers are locked when the programming key 220 is removed, other non-revenue related values can be changed. For example, the revenue-class electricity meter 10 permits the resetting of any of the min/max register values without the programming key 200. Using the input panels 36 and 38 located adjacent to the display 40 on the front panel 14 of the housing 12, an authorized person, upon entering a password, is able to reset any of the min/max register values. The password is used to reset peak demand register values. Other modules, links, and/or registers unrelated to the revenue quantities can also still be reconfigured.

Figure 8:
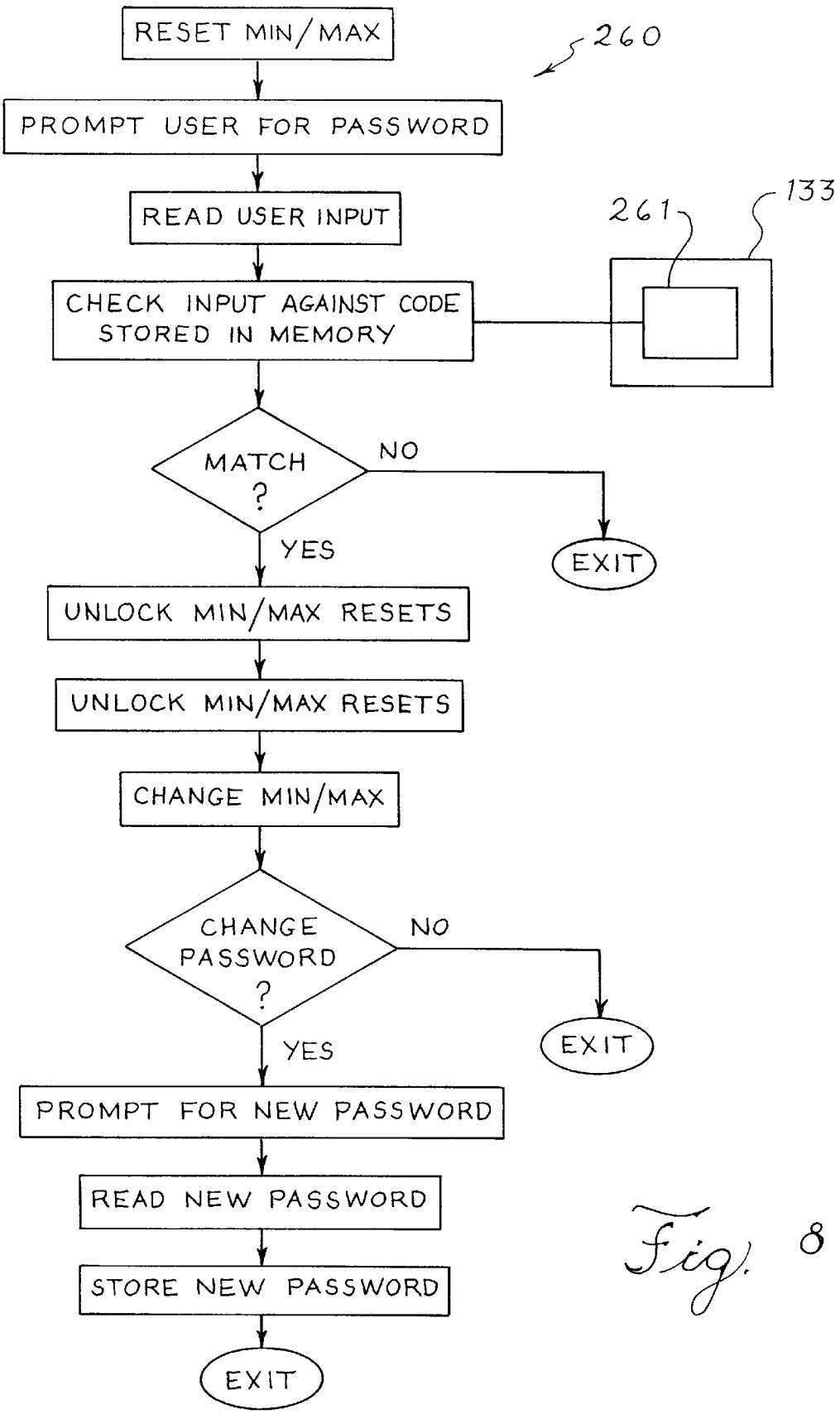
FIG. 8 is a diagram illustrating the password protection portion of the security system for the power meters of FIG. 1.

To implement the password security system, included in the meter is a password security routine 260. The password security routine (or program code segment) 260 may be stored in any of the non-volatile memories in the meter. A password 261 is also stored in a non-volatile memory in the meter. Referring to FIG. 8, in one embodiment, the password 261 is stored as a code word in the battery-backed RAM 133 on the CPU board 146. An authorized person, knowing the password 261, accesses the meter via the interface 20 to reset the min/max registers. Using the keypads 36 and 38 (FIG. 1) in conjunction with menu prompts generated by the password security code segment 260 and displayed on the display screen 40 (FIG. 1), the authorized person enters the password via the keypads 36 and/or 38. The program code segment 260 for resetting of the min/max register values compares the password entered via the input panel to the password stored in a predetermined memory address in the non-volatile memory 133 in the meter. The password may be stored in an encrypted format. If the password entered via the key pad matches the password 261 stored in the memory 133 of the meter, the security program segment 260 enables modification (e.g. resetting) of the min/max register values. The password code program segment 260 may also provide for changing the password by a person who has correctly entered a previous password. This limited access to modification of data in the meter may be extended to other types of data, including but not limited to some or all of the revenue-related data.

Figure 9:
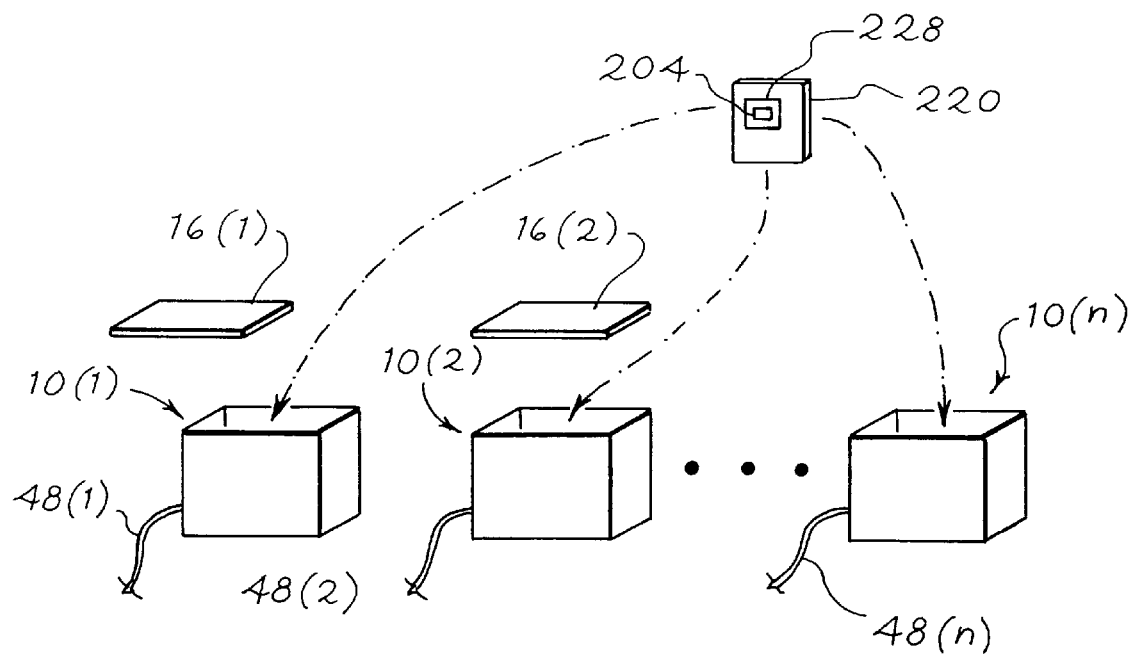
FIG. 9 is a diagram illustrating an arrangement for using a security programming key in a plurality of electricity meters.

After the electricity meter has been programmed and sealed, the programming key 220 can be used to reprogram other electricity meters. As illustrated in FIG. 9, the same programming key 220 can be used in each of a plurality of electricity meters 10(1), 10(2) . . . 10(n). In this embodiment, all the electricity meters 10(1), 10(2) . . . 10(n) are programmed to check for the same code word 204. Accordingly, the same programming key 220 can be used in each of the plurality of electricity meters. In this embodiment, each of the electricity meters 10(1), 10(2) . . . 10(n) can be programmed or re-programmed, but only one at a time since the programming key (including the code word 204) is required to be physically present in the meter in order for the security program to be unlocked. By limiting access to the programming key 200, the utility can effectively prevent tampering of the meters.

With the security provided by the programming key 220, especially in combination with the sealing arrangement 60 and password protected min/max register resets, the revenue-class electricity meter 10 is capable of meeting applicable government regulations (standards) and utility security requirements.

In one embodiment, the predetermined bit expression code word may be the same for all revenue-class electricity meters manufactured. This is possible since the distribution of the programming keys is limited. For example, if each utility that purchases electricity meters has only several keys and implements an internal security system that accounts for all its keys, then there is little likelihood that programming keys could be obtained illicitly by unauthorized persons. Therefore, in many situations it is possible to provide electricity meters that can all be unlocked by the same programming key to several different customers. In these situations, the additional security provided by the sealing arrangement would provide an indication that tampering may have taken place.

In another embodiment, a customer-utility may be provided with revenue-class electricity meters such that a programming key that works in its own electricity meters will not work in another company's electricity meters and vice versa. This can be accomplished by providing the first customer with a predetermined bit expression code word that is different from the predetermined bit expression code words in revenue-class electricity meters used by other customers. In this situation, the program code in the EEPROM 134 would be looking for a different bit pattern in the programming key. The programming keys provided to one customer would include a predetermined bit expression code word that would match the predetermined bit expression code word in all its own electricity meters, but would differ from the code words used by other customers. This approach may provide a higher level of confidence to a customer since the customer would be assured that no one else has programming keys that enable modification of the customer's electricity meters. Hence, if the customer implements a procedure that accounts for all of its own programming keys, it can be assured of a high level of security. Each customer can be provided with a unique predetermined bit expression code word during the manufacture of the electricity meters. For example, during manufacture of the electricity meter, when the programs including the utility for modifying the objects, links, and registers, are being installed into the non-volatile memories of the electricity meter, the unique predetermined bit expression code word for that particular customer is substituted into the utility program.

In another alternative embodiment, the electricity meters are reprogrammed after an initial programming. As mentioned above, there are certain quantities and data that are regarded as revenue-related. Some of these quantities are listed above. In the future, utilities, the government, or customers may desire to change the quantities upon which charges are based. Since the electricity meter can be reprogrammed, it is possible to readily modify its programming to account for the new quantities upon which charges will be based. This can be done by coupling a computer to a the data port 70 of the meter and downloading new programming into the non-volatile memory, e.g. EEPROM 134. When this is being done, the security program 200 used to reconfigure the restricted revenue-related quantities is also updated so that any changes to the revenue-related quantities are reflected in the program. Therefore, any new revenue-related quantities are locked against modification in the same manner as described above. A request to change the code in the EEPROM 134 also goes through the security code routines so that the code cannot be changed without the programming key installed. This prevents someone from changing the code to get around the security.

Another embodiment of the security system for the revenue-class electricity meter includes an encryption feature for the code words. According to this embodiment, the code word located on the programming key (e.g. word 204) and/or the conditional expression 203 in the security program 200 may be encrypted. Any suitable type of encryption may be used. Using an encryption scheme on either the code word 204, the conditional expression 203, or both, the code word 204 would not be derivable from examination of the conditional expression 203 and vice versa.

Figure 10:
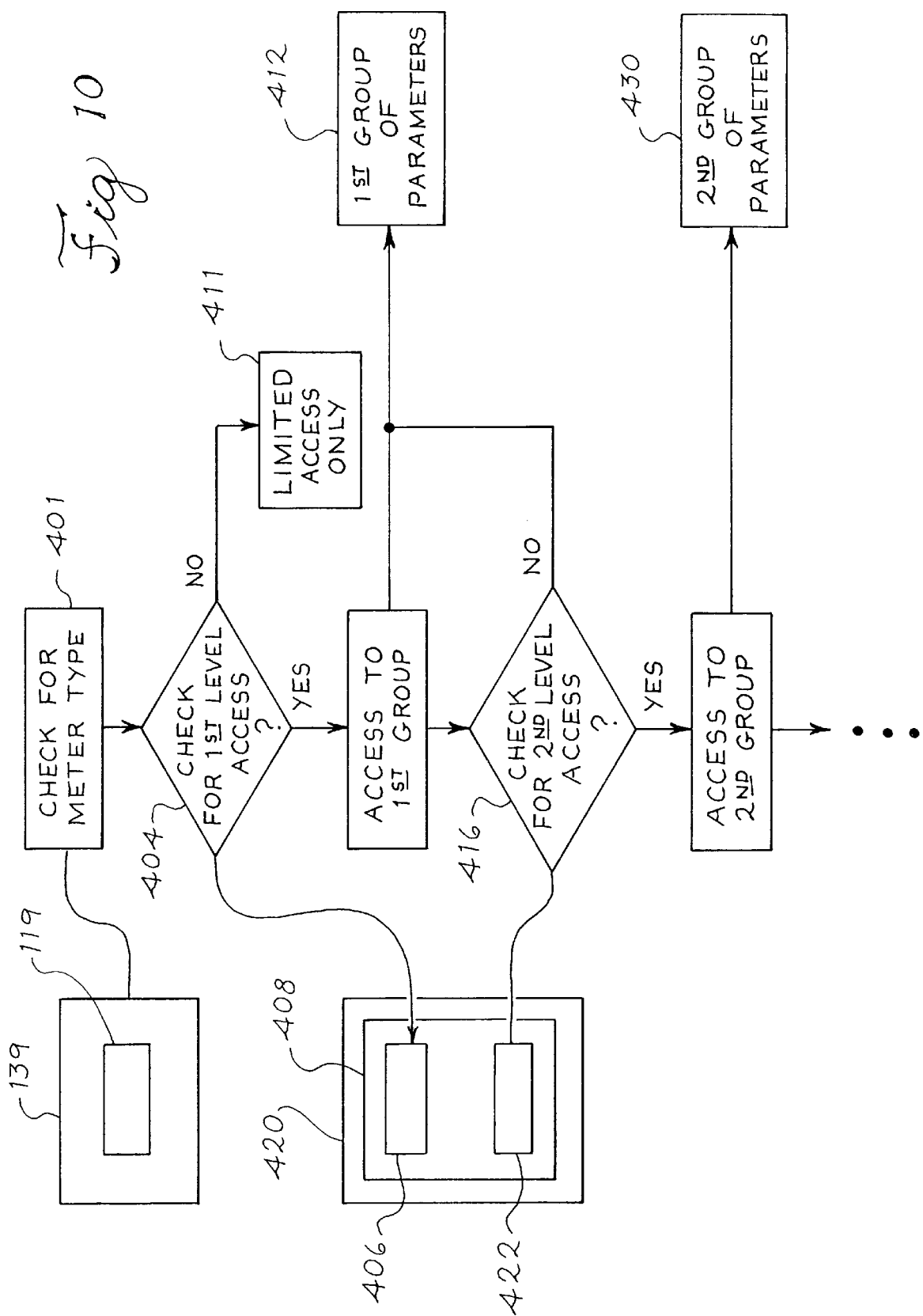
FIG. 10 is a block diagram of an alternative embodiment of the security program providing levels of restricted access.

In a still further embodiment, the security system implemented in the electricity meter can provide for several restricted levels of access to data and programming in the electricity meter. As mentioned above in the first embodiment, a security program 200 first checks to determine whether the meter is a revenue-class meter and if it is, then the security program 200 checks to see if the removable programming key 220 is installed by attempting to access a code word 204 at a predetermined memory address in a non-volatile memory 228 located on the removable programming key 220. The programming for an embodiment that includes several restricted levels of access is illustrated in FIG. 10. The embodiment of FIG. 10 is similar to the embodiment of FIGS. 1–8. In FIG. 10, a security program 400 first checks whether the meter is a revenue-class restricted level type of meter as in the first embodiment. This first checking step is done in a first conditional statement 401. If a code word is found in a memory in the meter that indicates that the meter is a revenue-class restricted level type of meter, then the security program 400 executes a second conditional statement 404. This second conditional statement 404 checks to see if the removable programming key 420 is installed by attempting to access another code word 406 at first predetermined memory address in a non-volatile memory 408 located on the removable programming key card 420. This second conditional statement 404 is met if the security program 400 finds the second code word 406 at the first predetermined memory address on the removable programming key card 420. If the second conditional statement 404 is satisfied, access is provided to a first group of programming parameters 412. (As in the first embodiment, if the second conditional statement is not met, modification of only a few or no parameters 411 is permitted since it is assumed that the programming key is not installed.) If the second conditional statement 404 is met, the security program 400 then executes a third conditional statement 416. In this third conditional statement 416, the security program attempts to access a third code 422 word located at a second predetermined memory address in the non-volatile memory 408 located on the removable programming key card 420. If the third conditional statement 416 is satisfied, access is provided to a second group of programming parameters 430 in addition to the first group 412 of programming parameters. Additional levels of access can be provided by including additional conditional statements in the security program 400 that check for additional code words on the programming key card. According to this embodiment, a plurality of key cards are provided. A lowest level access programming key card will have only the second code word 406, the next higher level programming key card will have the second code word 406 and the third code word 422, and so on. In this manner, it is possible to provide different persons with different levels of access to the programmability of the meter. Other programming designs and arrangements may be provided that accomplish similar results.

Yet another embodiment of a security system for a electricity meter uses jumpers or dip switches instead of a removable programming card. These jumpers dip switches may be located inside the housing of the electricity meter. Therefore, the jumpers or dip switches may be protected from unauthorized access by means of the sealing arrangement 60 shown in FIGS. 3A and 3B. According to this embodiment, a security program code segment is run, as in the other embodiments. In this embodiment, the security program code segment checks to see if a jumper has been installed (or removed) or whether the dip switches has been properly set. The jumper or dip switches are installed on one or more of the boards in the meter so that the state of the jumper or dip switch can be accessed over one of the internal data buses of the meter. In this manner, the security routine code segment can confirm the state of the jumper or dip switch. Only an authorized person would be informed about the jumper or dip switch settings. The particular setting of the jumper or dip switch is treated similarly to the code word on the programming card in the first embodiment. The security code segment routine checks this code word provided by either the jumper or the dip switch against a code stored in a memory of the meter to determine whether they correspond to each other. In other respects, this embodiment would be similar to the first embodiment.

Figure 11A:
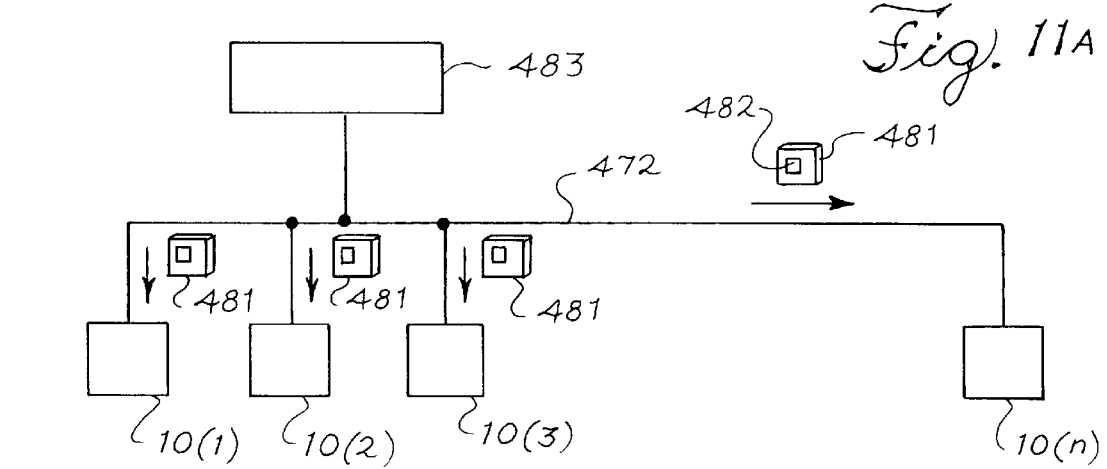
FIG. 11 is a block diagram of an alternative embodiment of the security system implemented on a network.
Figure 11B:
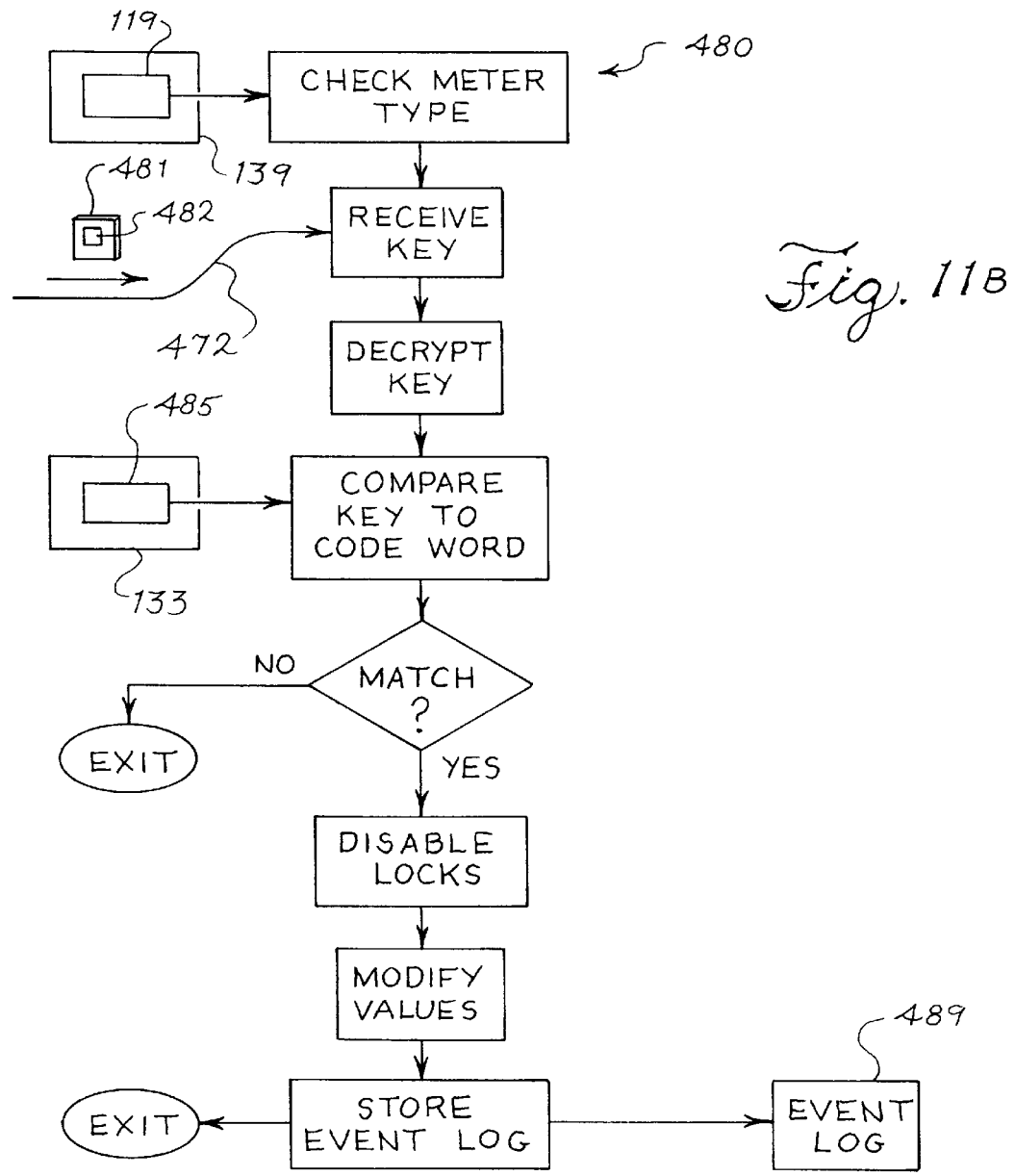

Another embodiment of a security system for an electricity meter is shown in FIGS. 11A and 11B. In this embodiment, a plurality of electricity meters 10(1), 10(2), 10(3) . . . 10(n) are connected to a data network 472. The connections of the plurality of electricity meters 10(1), 10(2), 10(3) . . . 10(n) to the data network 472 may be similar to the arrangement disclosed in FIG. 1 for the connection of the electricity meter 10 to the network 72. Running on each of the plurality of electricity meters is a security program code segment 480. The security program code segment 480 may be similar to the security program code segment 200, except as noted herein. Modification of values or parameters on one or more of the plurality of electricity meters 10(1), 10(2), 10(3) . . . 10(n) may be accomplished over the data network 472. In the embodiment of FIGS. 11A and 11B, modification of values or parameters on one or more of the plurality of electricity meters is enabled by means of a network password instead of using a physical card, such as the programming key 220 in FIG. 1. Using standard network protocols, a message 481 is sent to the one or more electricity meters containing the values or parameters in which modification is desired. In the embodiment of FIG. 11A, the message 481 is sent from a server 483 or other node on the network 472. The message 481 includes a code word 482. In a preferred embodiment, the message 481 and/or the code word 482 are encrypted. A conventional type of encryption may be used including public/private key encryption techniques. In each of the electricity meters that receives the message 481, a security code segment 480 is executed. As in the security program code segment 200 described above, the program 480 may first check whether the meter is a type of meter in which access is restricted. As in the first embodiment, this may be done by attempting to address a first code word (e.g. 119) stored in a memory (e.g. 139) in the meter. If it is determined that the meter is a type of meter in which access is restricted, the security program 480 then decrypts the code word 482 in the message 481. After the code word 482 is decrypted, it is compared to a code word 485 stored in a non-volatile memory in the meter. This non-volatile memory may be the same non-volatile memory in which the first code word 119 is stored or may be another of the memories in the meter. If the decrypted code word 482 received over the network 472 matches the code word 485 stored in the meter, the locks on the restricted parameter and values are temporarily disabled so that they can be modified. It is also possible to re-enable security in a similar fashion. As in one of the embodiments disclosed above, several levels of restricted access may be provided. After the parameters and values in the meter have been modified, the modification is stored as a transaction in an event log. 489. This event log 489 records all transactions wherein modification of the parameters or values in the meter has been made and whether security has been enabled/disabled. The event log also records the date and time of the access. The event log can also record the key used to enable or disable the security thereby enabling identification of the user who has gained access or altered the configuration of the meter. Accordingly, the event log can be used as a security backup to detect any unauthorized accesses to the meter.

Electronic Nameplate Feature

Government regulations or utility-mandates pertaining to revenue-class security meters require that each meter have a label affixed thereto. This label or nameplate identifies certain information about the meter. The information required on the nameplate may include some or all of the following: the serial number, the Government approval number, the meter class (reflecting the true-full scale rating of the meter), the accuracy class, the service field (reflecting the voltage mode setting, e.g. "SERVICE=2.0 Element Delta when VMODE is set to DELTA; SERVICE=2.5 Element Wye when VMODE is set to 3 WIRE WYE; or SERVICE= 3.0 Element Wye when VMODE is set to 4 WIRE WYE"), the voltage and current input ranges, the meter operating frequency (e.g. 50 or 60 Hz), the VT ratio and the CT ratio, the owner information (e.g. the utility-customer), the demand interval, the rate of pulse outputs, and optionally, customer meter identification information (e.g. "Owner", "Tag 1", and "Tag 2").

In conventional revenue-class meters, this information was printed on a label for each meter and the label was affixed to the meter. In the programmable revenue-class meter, described herein, this required information can be displayed on the display panel 40 on the front of the meter 10. Since the revenue-class meter 10 incorporates the security system features, disclosed above, the required information can be stored safely internally in the meter in one of the memories, such as EEPROM 134 or battery-backed RAM 133 (shown in FIG. 5).

Figure 12:
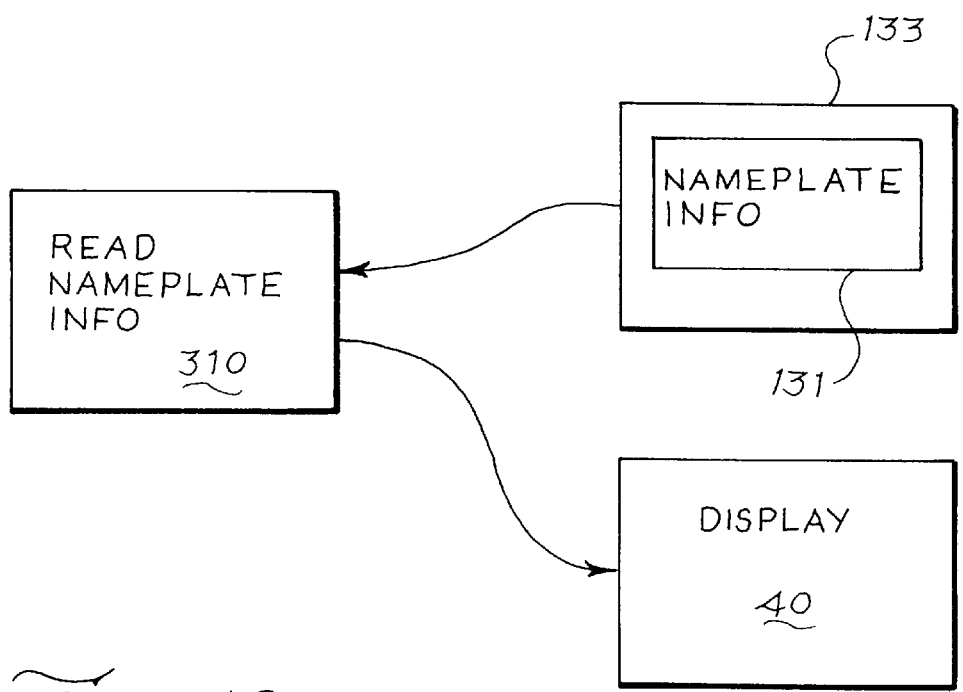
FIG. 12 is a block diagram illustrating a portion of the programming for display of the nameplate information of the revenue-class electricity meter of FIG. 1.
Figure 13:
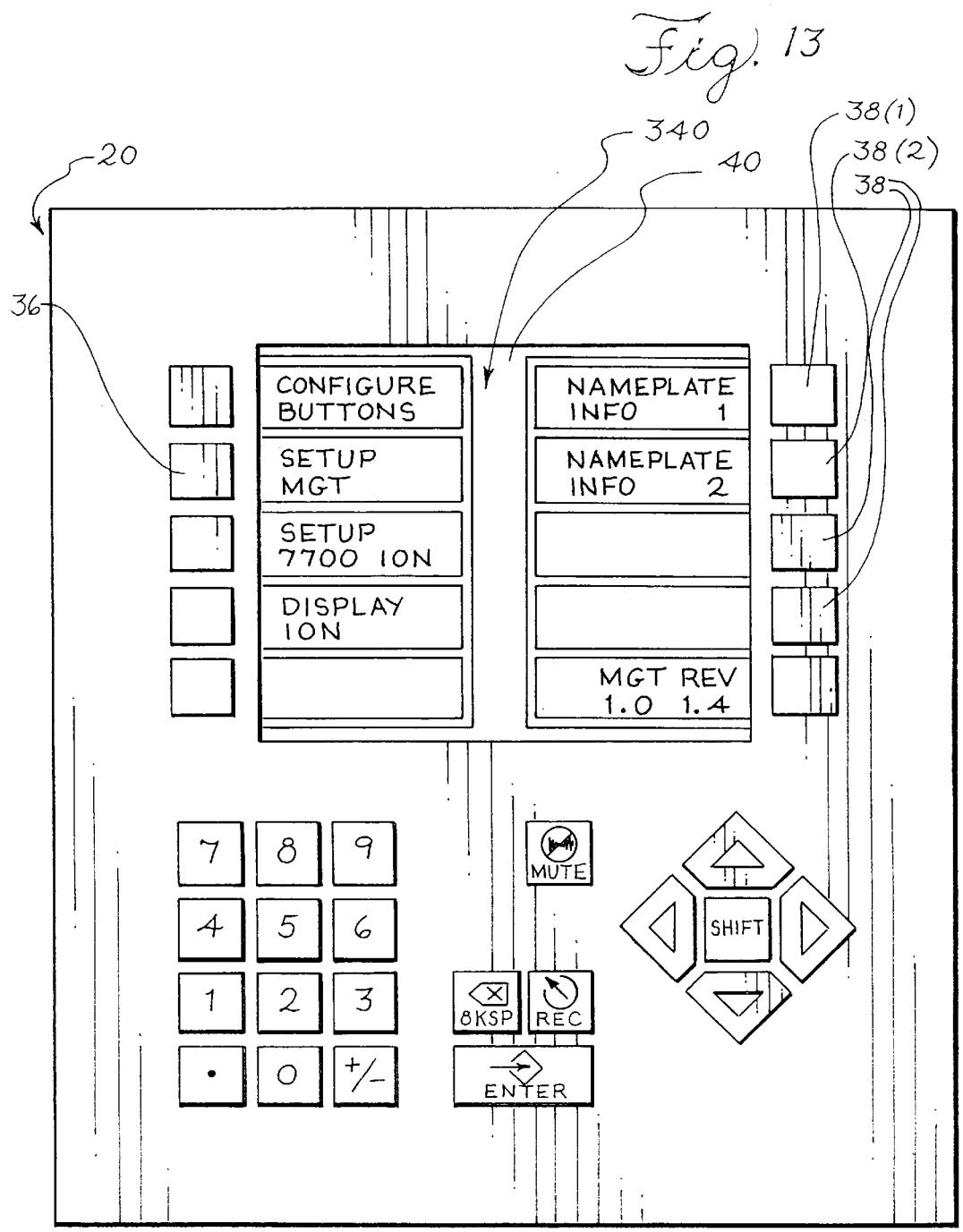
FIG. 13 is an illustration of the front side of the user interface portion of the embodiment of FIG. 1 illustrating a ready-to-use menu on the display screen.

Referring to FIG. 12, included in the programming in the revenue-class electricity meter 10 is a nameplate routine or code segment 310 that provides for the display of the required nameplate information on the display panel 40. Referring to FIG. 13, in a ready-to-use state, the display panel 40 of the interface 20 presents a ready menu 340. The ready menu 340 assigns certain functions or programs to the different keys in the key pads 36 and 38. In the ready menu 340, two keys are assigned to nameplate information. A first key 38(1) is assigned to "Nameplate Info 1" and a second key 38(2) is assigned to "Nameplate Info 2." Pressing either of these keys sends appropriate commands from the key pad to the nameplate program 310. Upon receiving the appropriate commands, the nameplate routine 310 reads the nameplate data 311 stored in one of the non-volatile memories, such as memory 133 of the meter, and writes the strings of these data to the display panel 40.

(A segment of the source code for an embodiment of the nameplate routine 310 is included in the appendix that forms part of the disclosure of this specification. In the source code, the following apply: outend is a variable indicating the length of the data to be sent to the display. make__packet( ) is a routine to append error checking to the data before it is sent to the display. dataout is a flag indicating whether the data has been transmitted yet. poll is a flag indicating whether to poll the display. recbuf is the buffer containing the request from the display. trambuf is the buffer containing the response data to be sent to the display.)

Figure 14:
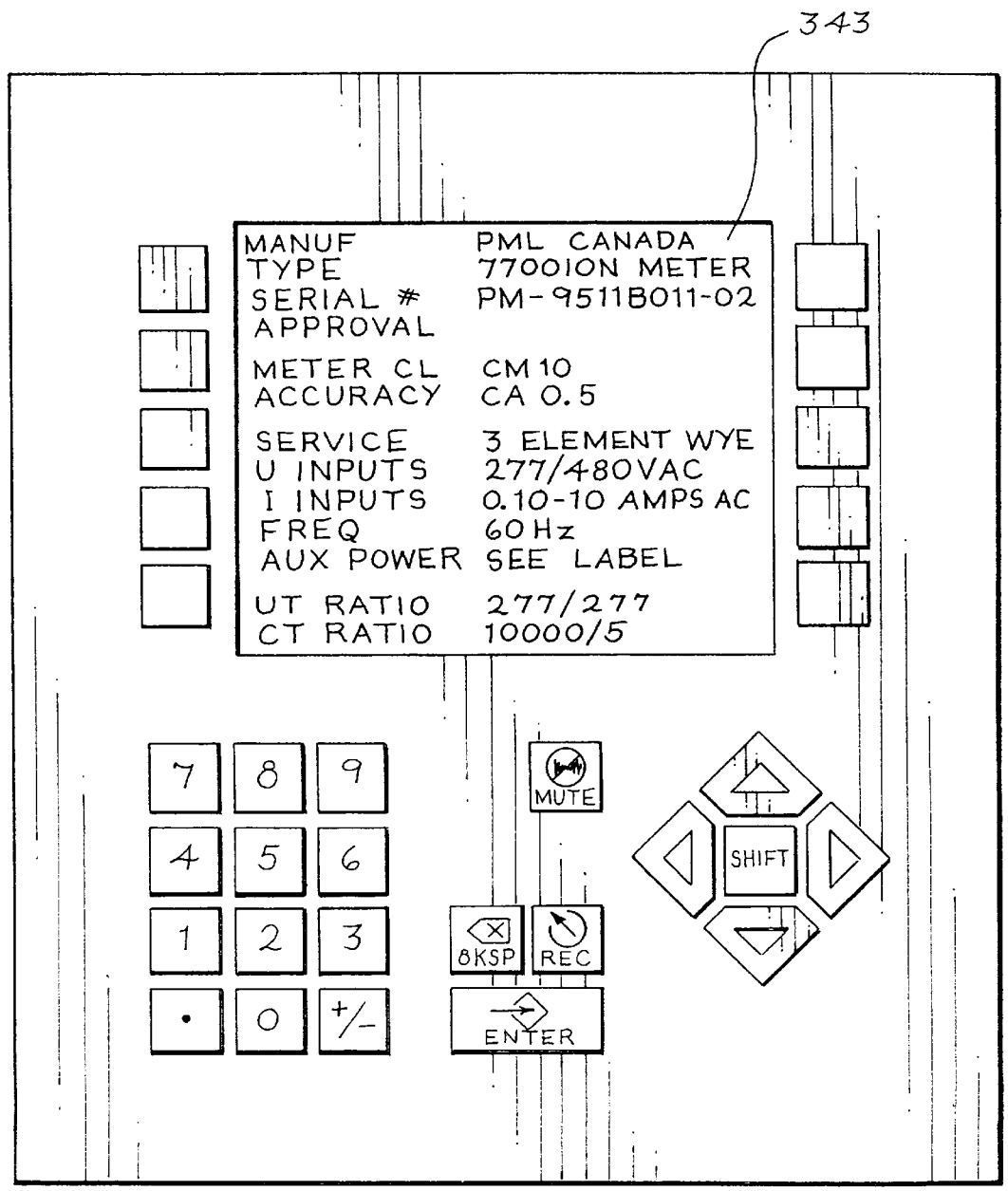
FIG. 14 is an illustration of the front side of the user interface portion of the embodiment of FIG. 1 illustrating a first screen of nameplate information on the display screen.
Figure 15:
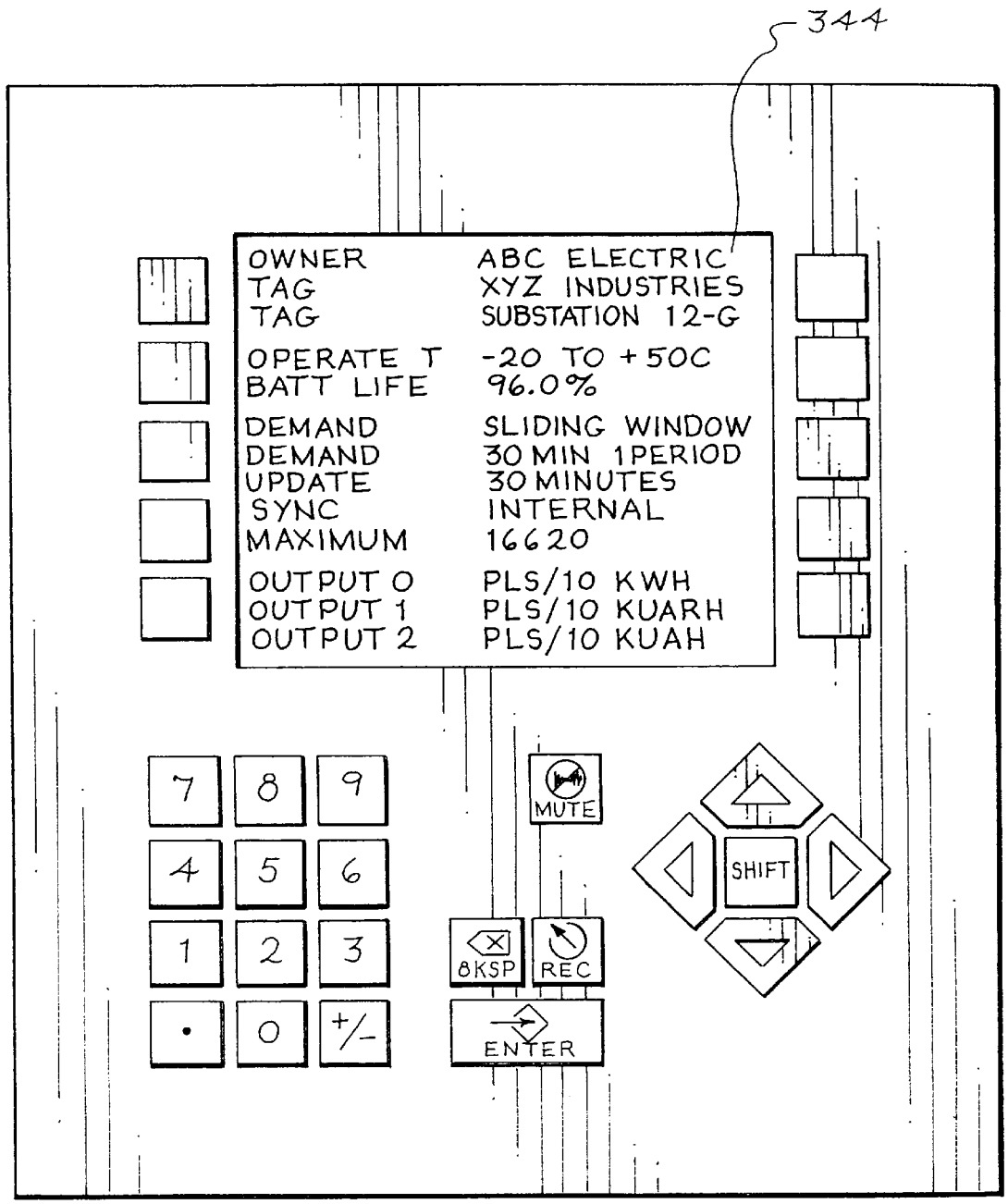
FIG. 15 is an illustration of the front side of the user interface portion of the embodiment of FIG. 1 illustrating a second screen of nameplate information on the display screen.

The different lines of nameplate information are related to nameplate he nameplate program 310. Buffers are used to temporarily store requests from the display panel key pads (e.g. 36 and 38 in FIG. 1) and data to be sent to the display (40 in FIG. 1). Activating the first key 38(1) for display of a first group of nameplate information causes the nameplate routine 310 to display the following information: the manufacturer of the meter, the model type of the meter, the serial number of the meter, the Government approval number, the meter class, the accuracy class, the service field, the voltage and current input ranges, the meter operating frequency, the VT ratio and the CT ratio. In this embodiment, the information is displayed on the display screen 40 in a format 343 as shown in FIG. 14. Activating the second key 38(2) for a second group of nameplate information causes the nameplate routine 310 to display the following information: the name of the owner, the demand interval, operating ranges, battery life, the rate of pulse outputs, and optional information that may be desired by the owners, such as location and so on. In this embodiment, this information is displayed on the display screen 40 in a format 344 as shown in FIG. 15.

Using the electronic storage of the nameplate information, in conjunction with the program 310 that writes the nameplate information to the display screen, the revenue-class electricity meter can fulfill the Government or utility-mandated requirements for displaying certain information about the meter by means of the display panel instead of using a printed label. In this manner, the expense of preparing, printing and affixing separate labels for each electricity meter is avoided.

It is intended that the foregoing detailed description be regarded as illustrative rather than limiting and that it is understood that the following claims including all equivalents are intended to define the scope of the invention.

We claim:

1. A revenue-class electricity meter comprising:
   a sensing portion that couples to an electrical power line and that is responsive to electricity in the power line, said sensing portion providing a digital output indicative of the electricity in said power line;
   a processor;
   a revenue-related program code segment adapted to run on said processor, said revenue-related code segment comprising revenue-related meter functions that generate revenue-related data stored in a memory of said meter; and
   a configurable non-revenue-related program code segment adapted to run on said processor, said non-revenue-related program code segment comprising non-revenue-related meter functions, wherein said non-revenue-related code segment permits user-modification of said non-revenue-related functions;
   a security program code segment adapted to run on said processor to permit modification of said revenue-related data, said security program including a function that receives an input code, compares the input code to a stored code in a memory of the meter, and unlocks restrictions preventing modification of said revenue-related data if said input code matches said stored code and wherein said non-revenue-related program code segment permits modification of said non-revenue-related functions independent of said security program.

2. The invention of claim 1 further comprising:
   a housing having an interior in which said processor is located;
   a removable cover providing access to said interior of said housing; and
   a mechanical sealing arrangement coupling said removable cover to said housing, said mechanical sealing arrangement providing a visual indication of removal of said removable cover.

3. The invention of claim 2 wherein said mechanical sealing arrangement comprises a lead ring.

4. The invention of claim 2 wherein said mechanical sealing arrangement comprises:
   a first tab located on said housing, said first tab having a first opening located therein;
   a second opening located on said removable cover, said first tab extending through said opening; and
   a ring extending through the first opening in said first tab to prevent removal of said removable cover from said housing without breaking of said ring.

5. The invention of claim 1 wherein said input code is stored on a removable card that can be installed in a slot inside said meter.

6. The invention of claim 5 wherein said card comprises a printed circuit board having a memory located thereon, and further wherein said input code is stored in said memory.

7. The invention of claim 1 wherein said input code is downloaded in a message over a data network to which said meter is coupled.

8. In combination:
   (1) a revenue-class electricity meter comprising:
      a metering portion that couples to an electrical power line and that is responsive to electricity in the power line, said metering portion providing a digital output indicative of the electricity in said power line;
      a processor;
      a first program run on the processor and responsive to the digital output of the metering portion, said first program having revenue-related functions that generate revenue-related values and non-revenue-related functions that generate non-revenue-related values using configurable program modules; and
      a slot coupled to said processor for receiving a programming key; and
   (2) a programming key adapted to be installed in said slot, said programming key including a memory having a code expression stored therein and preventing modification of said revenue-related functions in the absence of said code expression and said non-revenue-related functions being capable of being modified irrespective of the presence of said code expression.

9. A security system for a plurality of revenue-class electricity meters, wherein each of said plurality of revenue-class electricity meters comprises:
   a sensing portion that couples to an electrical power line and that is responsive to electricity in the power line, said sensing portion providing a digital output indicative of the electricity in said power line;
   a processor;
   a first program run on the processor and responsive to the digital output of the sensing portion memory, said first program including a first code segment adapted to provide at least one revenue-related function that generates at least one revenue-related value and a second, configurable non-secure code segment that provides at least one non-revenue-related function that generates at least one non-revenue-related value, said second code segment configured to permit user-modification of at least one non-revenue-related function;
   a second program adapted to modify said first program, said second program including a function that checks for the presence of a function code and prevents modification of the revenue-related functions of said first program in the absence of said code, the non-revenue-related functions being configurable by a user irrespective of the presence of said code;
   a slot coupled to said processor for receiving a programming key; and
   a programming key adapted to be used in each revenue-class electricity meter of said plurality of revenue-class electricity meters, said programming key providing said code.

10. The invention of claim 9 wherein each revenue class electricity meter of said plurality of revenue class security meters, further comprises:
   a housing having an interior in which said slot is located;
   a removable cover providing access to said interior of said housing; and
   a mechanical sealing arrangement coupling said removable cover to said housing, said mechanical sealing arrangement providing a visual indication of removal of said removable cover.

11. The invention of claim 10 wherein said mechanical sealing arrangement comprises a lead ring.

12. The invention of claim 10 wherein said mechanical sealing arrangement comprises:
   a first tab located on said housing, said first tab having a first opening located therein;
   an second opening located on said removable cover, said first tab extending through said opening; and
   a ring extending through the first opening in said first tab to prevent removal of said removable cover from said housing without breaking of said ring.

13. A method of operating a plurality of revenue-class electricity meters, comprising the steps of:
   providing a first program run on a processor in said plurality of revenue-class electricity meters responsive to the digital output of a metering portion of a memory, said first program providing revenue-related functions that generate revenue-related values and configurable non-revenue-related functions that generate non-revenue-related values, and
   locking said first program to prevent modification of said revenue-related functions in the absence of a key;
   providing a key, said key unlocking said first program to permit modification of said revenue-related functions and said non-revenue-related functions being capable of being configured irrespective of the presence of said key;
   obtaining access to an interior of a housing of a revenue-class electricity meter;
   installing said key;
   operating a program to modify revenue-related values in the programming of the revenue-class electricity meter, wherein said program checks that the key has been installed;
   removing the key from said revenue-class electricity meter; and
   closing the housing of the revenue-class electricity meter to prevent access to the interior thereof.

14. The invention of claim 13 further comprising the step of:
   after the step of closing the housing of the revenue class electricity meter, installing a sealing arrangement on said housing of the revenue class electricity meter, said sealing arrangement preventing access to the interior of said housing.

15. The invention of claim 13 further comprising the step of:
   after the step of closing the housing of the revenue class electricity meter, installing a sealing arrangement on said housing of the revenue class electricity meter, said sealing arrangement providing a visual indication if the housing is reopened.

16. The invention of claim 13 further comprising the step of:
   after the step of closing the housing of the revenue class electricity meter, obtaining access to an interior of a housing of a second revenue class electricity meter;
   installing the programming key into a connector located inside said housing of said second revenue class electricity meter;

operating a program to modify revenue-related values in the programming of second revenue class electricity meter, wherein said program checks that the programming key has been installed;

removing the programming key from said second revenue class electricity meter; and closing the housing of the second revenue class electricity meter to prevent access to the interior thereof.

17. The method of claim 13 wherein said step of installing a key comprises using at least one jumper.

18. The method of claim 13 wherein the step of installing a key comprises using a removable program card that is received into a connector in said electricity meter and includes a memory having said key in the form of a code stored therein.

19. The meter of claim 1 comprising at least one jumper disposed within said meter that provides said input code.

20. In combination:
   a revenue-class electricity meter comprising:
      a metering portion that couples to an electrical power line and that is responsive to electricity in the power line, said metering portion providing a digital output indicative of the electricity in said power line;
      a processor;
      a first program run on the processor and responsive to the digital output of the metering portion, said first program adapted to provide revenue-related functions that generate revenue-related values and non-revenue-related functions that generate non-revenue-related values using configurable program modules; and
      a key code, wherein said revenue-related functions are locked to prevent modification thereof in the absence of said key code and said non-revenue-related functions being capable of being modified irrespective of the presence of said key code.

21. The combination of claim 20 comprising at least one jumper disposed within said meter, said jumper providing said key code.

22. The combination of claim 20 comprising a programming key adapted to be installed in said meter, said programming key including a memory having said key code located therein.

23. A security system for a plurality of revenue-class electricity meters, wherein each of said plurality of revenue-class electricity meters comprises:
   a sensing portion that couples to an electrical power line and that is responsive to electricity in the power line, said sensing portion providing a digital output indicative of the electricity in said power line;
   a processor;
   a key code adapted for use in each revenue-class electricity meter of said plurality of revenue-class security meters;
   a first program run on the processor and responsive to the digital output of the sensing portion memory, said first program including a first code segment adapted to provide at least one revenue-related function that generates at least one revenue-related value and a second, configurable non-secure code segment that provides at least one non-revenue-related function that generates at least one non-revenue-related value, said second code segment permitting user-modification of said at least one non-revenue-related function; and
   a second program adapted to modify said first program, said second program including a function that checks for the presence of a key code and prevents modification of said at least one revenue-related function of said first program in the absence of said key code, the at least one non-revenue-related function being configurable by a user irrespective of the presence of said key code.

24. The security system of claim 23 comprising at least one jumper disposed within each of said meters, said jumper providing said key code.

25. The security system of claim 23 comprising a programming key adapted to be installed in each of said meters, said programming key including a memory having said key code located therein.

26. The invention of claim 1 wherein the input code is encrypted.

27. The invention of claim 7 wherein the input code is encrypted.

* * * * *

UNITED STATES PATENT AND TRADEMARK OFFICE
CERTIFICATE OF CORRECTION

PATENT NO. : 6,000,034
DATED : December 7, 1999
INVENTOR(S) : Simon Lightbody et al.

It is certified that error appears in the above-identified patent and that said Letters Patent is hereby corrected as shown below:

Title page,
Column 1,
Line 1, under "U.S. PATENT DOCUMENTS", delete "7/1936" and substitute -- 7/1934 -- in its place.

Signed and Sealed this

Twenty-eighth Day of August, 2001

Attest:

NICHOLAS P. GODICI
Attesting Officer   Acting Director of the United States Patent and Trademark Office